(12) United States Patent
Kim et al.

(10) Patent No.: US 10,671,124 B2
(45) Date of Patent: Jun. 2, 2020

(54) ROLLABLE DISPLAY DEVICE

(71) Applicant: Samsung Display Co., Ltd., Yongin-Si, Gyeonggi-Do (KR)

(72) Inventors: Jeongho Kim, Seoul (KR); Hyunwoo Koo, Hwaseong-si (KR); Kyuyoung Kim, Suwon-si (KR); Taewoong Kim, Seongnam-si (KR); Jinhwan Choi, Seoul (KR); Hayk Kachatryan, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/238,388

(22) Filed: Jan. 2, 2019

(65) Prior Publication Data
US 2019/0204874 A1 Jul. 4, 2019

(30) Foreign Application Priority Data

Jan. 4, 2018 (KR) ........................ 10-2018-0001250

(51) Int. Cl.
| | | |
|---|---|---|
| *H05K 1/00* | (2006.01) | |
| *G06F 1/16* | (2006.01) | |
| *H05K 5/00* | (2006.01) | |
| *H01L 51/00* | (2006.01) | |
| *G09F 9/30* | (2006.01) | |

(52) U.S. Cl.
CPC ............ G06F 1/1652 (2013.01); G09F 9/301 (2013.01); H01L 51/0097 (2013.01); H05K 5/0017 (2013.01); *H01L 2251/5338* (2013.01)

(58) Field of Classification Search
CPC ...... G06F 1/1643; G06F 1/1652; G09F 9/301; H01L 2251/5338; H01L 51/0097; H05K 5/0017
See application file for complete search history.

(56) References Cited

U.S. PATENT DOCUMENTS

| | | | |
|---|---|---|---|
| 7,786,951 B2 | 8/2010 | Huitema et al. | |
| 9,874,772 B2 | 1/2018 | Kim et al. | |
| 2011/0043479 A1* | 2/2011 | van Aerle | G06F 1/1601 345/174 |
| 2016/0212840 A1* | 7/2016 | Koo | G06F 1/1626 |
| 2016/0233453 A1* | 8/2016 | Lee | H01L 51/5256 |

(Continued)

FOREIGN PATENT DOCUMENTS

| | | |
|---|---|---|
| KR | 10-1044461 B1 | 6/2011 |
| KR | 10-2016-0104808 A | 9/2016 |

(Continued)

*Primary Examiner* — Yuriy Semenenko
(74) *Attorney, Agent, or Firm* — Lewis Roca Rothgerber Christie LLP

(57) ABSTRACT

A rollable display device includes: a window member; a first pressure sensitive adhesive member arranged under the window member; a display module detachable from and attachable to the window member by the first pressure sensitive adhesive member; a housing having a groove through which the window member, the first pressure sensitive adhesive member, and the display module are configured to enter and exit from the housing; a first rotation member on which the window member and the first pressure sensitive adhesive member are rollable or slidable; and a second rotation member on which the display module is rollable or slidable.

20 Claims, 18 Drawing Sheets

(56) References Cited

U.S. PATENT DOCUMENTS

| | | | | |
|---|---|---|---|---|
| 2016/0255713 A1* | 9/2016 | Kim | ................ | G02F 1/133305 |
| | | | | 361/749 |
| 2017/0222178 A1* | 8/2017 | Kang | ................ | H01L 51/0097 |
| 2017/0295654 A1* | 10/2017 | Choi | ................ | H05K 5/0017 |
| 2018/0110137 A1* | 4/2018 | Kim | ................ | G06F 1/1652 |
| 2018/0341142 A1* | 11/2018 | Choi | ................ | H01L 27/3246 |
| 2019/0036048 A1* | 1/2019 | Lee | ................ | H01L 51/5237 |
| 2020/0008308 A1* | 1/2020 | Shin | ................ | H01L 51/5253 |

FOREIGN PATENT DOCUMENTS

| | | |
|---|---|---|
| KR | 10-2016-0129668 A | 11/2016 |
| KR | 10-2018-0130641 A | 12/2018 |

\* cited by examiner

ROLLABLE DISPLAY DEVICE

CROSS-REFERENCE TO RELATED APPLICATION

This application claims priority to and the benefit of Korean Patent Application No. 10-2018-0001250, filed on Jan. 4, 2018 in the Korean Intellectual Property Office, the entire content of which is herein incorporated by reference.

BACKGROUND

1. Field

Aspects of embodiments of the invention relate to a rollable display device.

2. Description of the Related Art

Flexible display devices have been developed by demands of a market. Flexible display devices may include a curved display device fixed in a state having a specific curvature, a foldable display device bendable at a specific radius of curvature or more or bendable around a folding axis, and a rollable display device rollable at a specific radius of curvature. The rollable display device among the flexible display devices may have both a wide display area and excellent portability, and, thus, various research for the rollable display device is being conducted.

A display panel of the rollable display device may have a structure in which various components are stacked. By stress generated when the rollable display device is rolled, the components may be detached from each other, or a crack may be generated at one or more of the components.

SUMMARY

According to an aspect of embodiments of the invention, a rollable display device is capable of reducing or relieving stress generated by a rolling operation. According to another aspect of embodiments of the invention, a rollable display device may have improved reliability by reducing or relieving stress applied to components of a display panel when the display panel is rolled.

According to one or more embodiments of the invention, a rollable display device includes: a window member; a first pressure sensitive adhesive member arranged under the window member; a display module detachable from and attachable to the window member by the first pressure sensitive adhesive member; a housing having a groove through which the window member, the first pressure sensitive adhesive member, and the display module are configured to enter and exit from the housing; a first rotation member on which the window member and the first pressure sensitive adhesive member are rollable or slidable; and a second rotation member on which the display module is rollable or slidable.

The window member may include a first window surface defined by a first direction and a second direction, and a second window surface opposite to the first window surface in a thickness direction.

The first pressure sensitive adhesive member may be fixed on the second window surface. The first pressure sensitive adhesive member may include an acrylic-based adhesive material.

The display module may face the window member with the first pressure sensitive adhesive member therebetween and may include a first module surface detachable from and attachable to the first pressure sensitive adhesive member, and a second module surface opposite to the first module surface.

The housing may have a groove through which the window member, the first pressure sensitive adhesive member and the display module are configured to enter and exit from the housing in the first direction.

The first rotation member may be in the housing and may extend in the second direction. The window member and the first pressure sensitive adhesive member may be rollable or slidable on the first rotation member.

The second rotation member may be spaced apart from the first rotation member in the housing and may extend in the second direction. The display module may be rollable or slidable on the second rotation member.

When the display module, the window member, and the first pressure sensitive adhesive member enter the housing, the first module surface of the display module may be detached from a bottom surface of the first pressure sensitive adhesive member such that the display module is spaced apart from the window member.

When the display module, the window member and the first pressure sensitive adhesive member exit from the housing, the first module surface of the display module may be attached to the bottom surface of the first pressure sensitive adhesive member such that the display module is integrated with the window member.

In an embodiment, in an unrolled state, a length of the window member extending in the first direction may be greater than a length of the display module extending in the first direction. The first rotation member may be located under the first pressure sensitive adhesive member, and the second rotation member may be located under the second module surface of the display module. The first rotation member may be farther away from the groove in the first direction than the second rotation member is from the groove.

In an embodiment, in an unrolled state, a length of the window member extending in the first direction may be equal to a length of the display module extending in the first direction. The first rotation member may be located on the first window surface of the window member, and the second rotation member may be located under the second module surface of the display module. A distance of the first rotation member from the groove in the first direction may be equal to a distance of the second rotation member from the groove in the first direction.

In an embodiment, the display module may include a display panel to display an image, a driving substrate electrically connected to the display panel and extending in the second direction, and a connection substrate connecting the display panel and the driving substrate. The driving substrate may be arranged in the second rotation member, and the display panel may be rollable on the second rotation member.

In an embodiment, the rollable display device may further include a handle extending in the second direction and coupled to the display module. The driving substrate may be arranged in the handle, and the display panel may be slidable on the second rotation member.

In an embodiment, the rollable display device may further include a cleaning rotation member in the housing and located under the first pressure sensitive adhesive member to remove a foreign material attached to the first pressure sensitive adhesive member when the first pressure sensitive adhesive member and the display module are detached from each other.

In an embodiment, the rollable display device may further include a protective member, a second pressure sensitive adhesive member, and a third rotation member.

The protective member may be under the display module and may include a first protective surface facing the second module surface, and a second protective surface opposite to the first protective surface. The first protective surface may be between the second module surface and the second protective surface.

The second pressure sensitive adhesive member may be fixed on the first protective surface and may be detachable from and attachable to the second module surface.

The third rotation member may be spaced apart from the first and second rotation members in the housing, and the protective member and the second pressure sensitive adhesive member may be rollable or slidable on the third rotation member.

When the display module, the window member, the first pressure sensitive adhesive member, the protective member, and the second pressure sensitive adhesive member enter the housing, the second module surface of the display module may be detached from a top surface of the second pressure sensitive adhesive member such that the display module is spaced apart from the protective member.

When the display module, the window member, the first pressure sensitive adhesive member, the protective member, and the second pressure sensitive adhesive member exit from the housing, the second module surface of the display module may be attached to the top surface of the second pressure sensitive adhesive member such that the display module is integrated with the protective member.

In an embodiment, the protective member may include a plurality of supporting blocks extending in the second direction and arranged in the first direction. Adjacent ones of the supporting blocks may be connected to each other by a hinge.

In an embodiment, in an unrolled state, a length of the window member extending in the first direction may be greater than a length of the display module extending in the first direction, and, in the unrolled state, the length of the display module extending in the first direction may be greater than a length of the protective member extending in the first direction. The first rotation member may be located under the first pressure sensitive adhesive member, the second rotation member may be located under the second module surface of the display module, and the third rotation member may be located under the second protective surface of the protective member. The first rotation member may be farther away from the groove in the first direction than the second rotation member is from the groove, and the second rotation member may be farther away from the groove in the first direction than the third rotation member is from the groove.

When the display module, the window member, the first pressure sensitive adhesive member, the protective member, and the second pressure sensitive adhesive member enter the housing, the first rotation member, the second rotation member, and the third rotation member may be rotatable in a counterclockwise direction.

In an embodiment, in an unrolled state, a length of the window member extending in the first direction may be less than a length of the display module extending in the first direction, and, in the unrolled state, a length of the protective member extending in the first direction may be less than or equal to the length of the display module extending in the first direction. In this case, the first rotation member may be located on the window member, the second rotation member may be located on the first module surface or under the second module surface of the display module, and the third rotation member may be located under the second protective surface of the protective member. The first rotation member may be closer to the groove in the first direction than the second rotation member. The second rotation member may be farther away from the groove in the first direction than the third rotation member, or a distance of the second rotation member from the groove in the first direction may be equal to a distance of the third rotation member from the groove in the first direction.

Each of the first, second, and third rotation members may have a cylindrical shape.

In an embodiment, a radius of the first rotation member, a radius of the second rotation member, and a radius of the third rotation member may be equal to each other. In this case, the window member may be rolled on the first rotation member, the display module may be rolled on the second rotation member, and the protective member may be rolled on the third rotation member.

In an embodiment, a radius of the first rotation member and a radius of the third rotation member may be greater than a radius of the second rotation member. In this case, the window member may be slidable by the first rotation member, the display module may be rollable on the second rotation member, and the protective member may be slidable by the third rotation member.

In an embodiment, the rollable display device may further include a first pressing rotation member and a second pressing rotation member.

The first pressing rotation member may include a first roller on the window member in the housing, and a second roller under the display module in the housing.

The second pressing rotation member may be adjacent to the groove in the housing and may include a third roller on the window member and a fourth roller under the protective member.

When the window member, the first pressure sensitive adhesive member, the display module, the second pressure sensitive adhesive member, and the protective member exit from the housing, the first roller and the second roller may respectively press the window member and the display module to attach the top surface of the display module to the bottom surface of the first pressure sensitive adhesive member such that the display module is integrated with the window member, and the third roller and the fourth roller may respectively press the window member and the display module integrated with each other and the protective member to attach the bottom surface of the display module to the top surface of the second pressure sensitive adhesive member such that the display module is integrated with the protective member.

In an embodiment, the rollable display device may be installed in a vehicle. The housing may be installed in a portion of the vehicle, and the display module may provide the image to a driver.

BRIEF DESCRIPTION OF THE DRAWINGS

The above and other aspects and features of the present invention will become more apparent by describing in further detail some exemplary embodiments thereof with reference to the accompanying drawings, in which.

DETAILED DESCRIPTION

Figure 1:
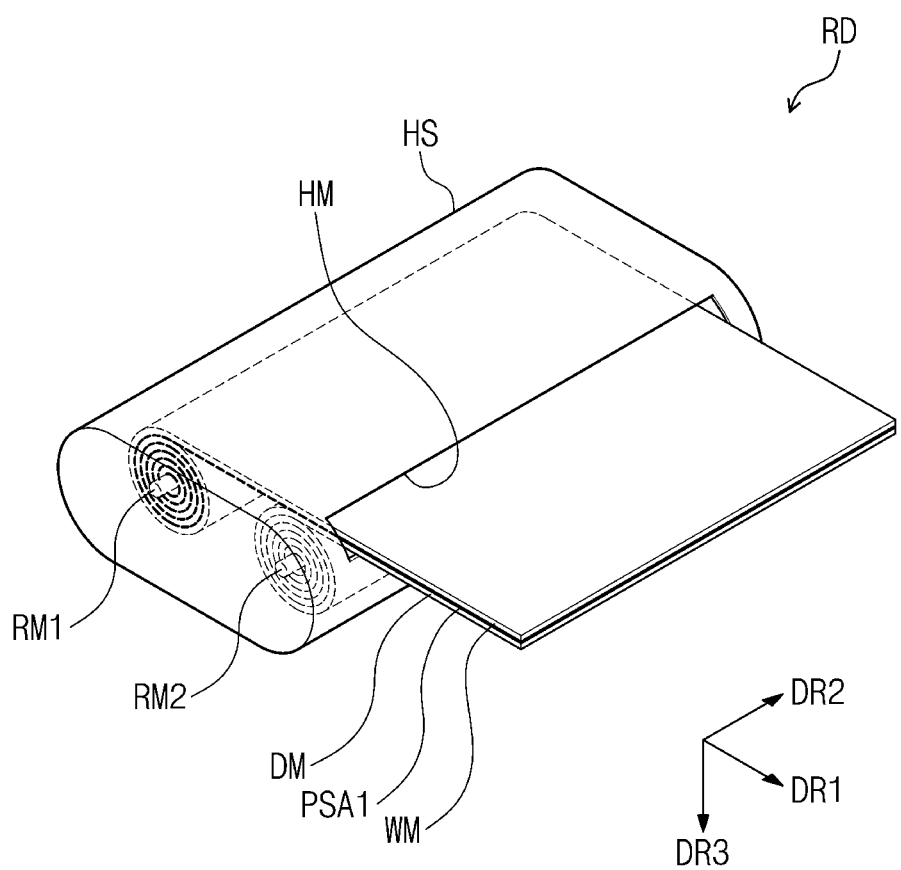
FIGS. 1 and 2 are perspective views schematically illustrating a rollable display device according to an embodiment of the invention.

The invention will be described more fully herein with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout. It is to be understood that when an element, such as a layer, region, or substrate, is referred to as being "on" another element, it may be directly on the other element or one or more intervening elements may be present. In contrast, the term "directly" means that there are no intervening elements. As used herein, the term "and/or" includes any and all combinations of one or more of the associated listed items.

The terminology used herein is for the purpose of describing particular embodiments and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It is to be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. It is to be understood that, although the terms "first," "second," etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a "first" element, component, region, layer, or section discussed below could be termed a "second" element, component, region, layer, or section without departing from the teachings herein.

Some exemplary embodiments are described herein with reference to cross-sectional illustrations and/or plane illustrations that may be idealized exemplary illustrations. In the drawings, the thicknesses of layers and regions may be exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein, but are to include deviations in shapes that result, for example, from manufacturing. For example, an etching region illustrated as a rectangle will, typically, have rounded or curved features. Thus, the regions illustrated in the figures may be schematic in nature and their shapes not intended to illustrate the actual shape of a region of a device, and are not intended to limit the scope of exemplary embodiments.

Herein, some exemplary embodiments of the invention will be described in further detail with reference to the accompanying drawings.

Figure 2:
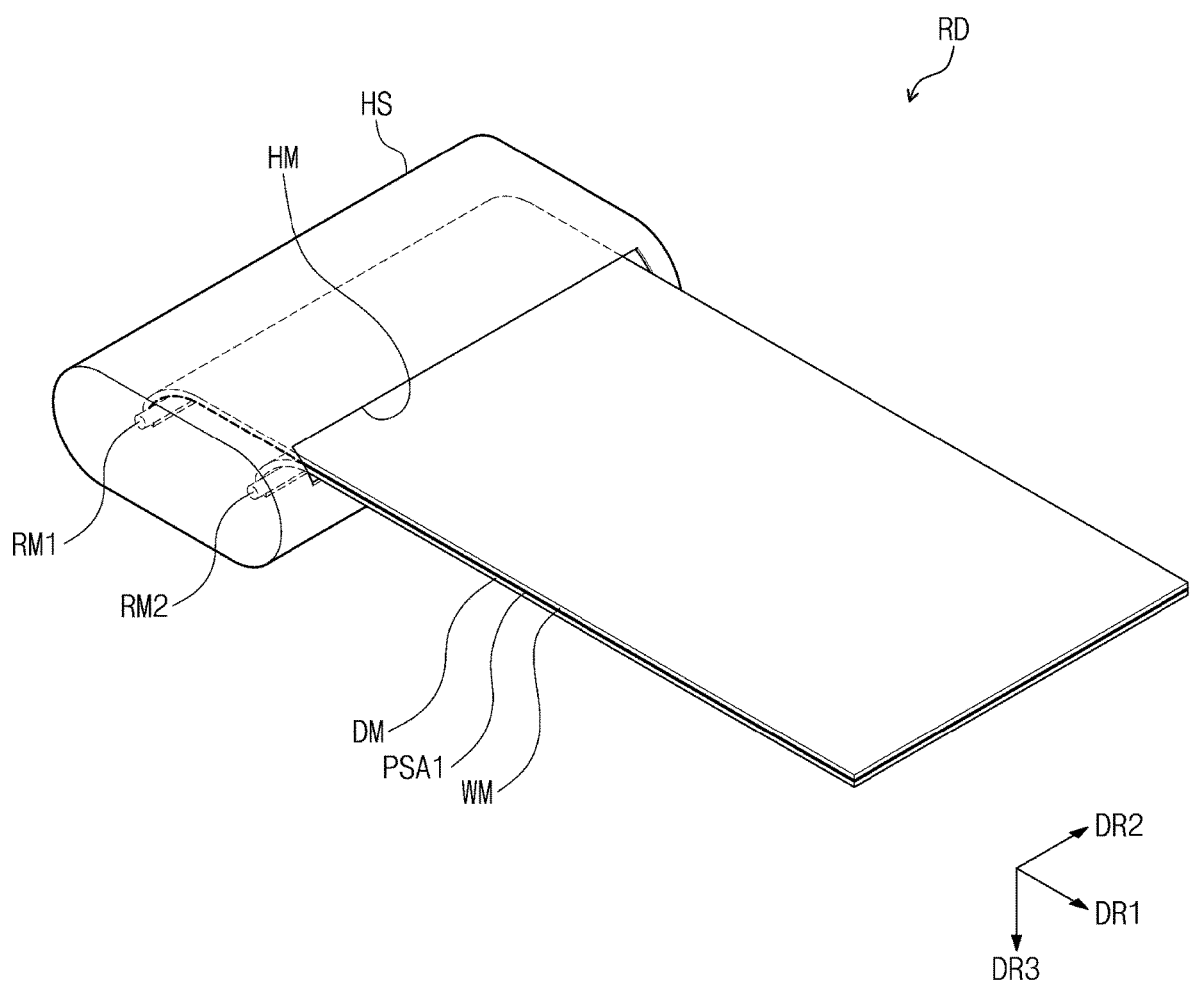

FIGS. 1 and 2 are perspective views schematically illustrating a rollable display device RD according to an embodiment of the invention.

Referring to FIGS. 1 and 2, the rollable display device RD may include a display module DM, a window member WM, a first pressure sensitive adhesive member PSA1, a housing HS, a first rotation member RM1, and a second rotation member RM2.

The display module DM may provide an image. The window member WM may be disposed on the display module DM to protect the display module DM. The first pressure sensitive adhesive member PSA1 may be disposed between the display module DM and the window member WM. The first pressure sensitive adhesive member PSA1 may detach the window member WM from the display module DM and may attach the window member WM to the display module DM.

The display module DM, the window member WM, and the first pressure sensitive adhesive member PSA1 may enter the housing HS and may be stored in the housing HS.

A groove HM through which the display module DM, the window member WM, and the first pressure sensitive adhesive member PSA1 enter and exit in parallel to a first direction DR1 may be defined in an area of the housing HS. FIG. 1 illustrates an embodiment in which the display module DM, the window member WM, and the first pressure sensitive adhesive member PSA1 enter and exit through one groove HM. However, embodiments of the invention are not limited thereto. In one or more embodiments, a first groove and a second groove may be defined in the housing HS. In an embodiment, for example, the display module DM may enter and exit through the first groove, and the window member WM and the first pressure sensitive adhesive member PSA1 may enter and exit through the second groove.

The first rotation member RM1 and the second rotation member RM2 may be disposed in the housing HS. The first rotation member RM1 and the second rotation member RM2 may be spaced apart from each other in the first direction DR1. Each of the first and second rotation members RM1 and RM2 may have a cylindrical shape extending in a second direction DR2. Each of the first and second rotation members RM1 and RM2 may rotate in a clockwise direction or a counterclockwise direction about a rotation axis extending in the second direction DR2.

The first rotation member RM1 may be coupled to the window member WM or the first pressure sensitive adhesive member PSA1. The window member WM and the first pressure sensitive adhesive member PSA1 may be rolled on or may slide on the first rotation member RM1 or may be unrolled from the first rotation member RM1. In an embodiment, the first rotation member RM1 may be adhered to the first pressure sensitive adhesive member PSA1 or may be adhered to the window member WM through an adhesive. In another embodiment, the window member WM and the first pressure sensitive adhesive member PSA1 may be inserted in an engaging groove (not shown) provided in the first rotation member RM1, and, thus, the window member WM and the first pressure sensitive adhesive member PSA1 may be coupled to the first rotation member RM1.

The second rotation member RM2 may be coupled to the display module DM. The display module DM may be rolled on or may slide on the second rotation member RM2 or may be unrolled from the second rotation member RM2. In an embodiment, the display module DM may be adhered to the second rotation member RM2 through an adhesive or may be inserted in an engaging groove (not shown) provided in the second rotation member RM2.

Figure 3:
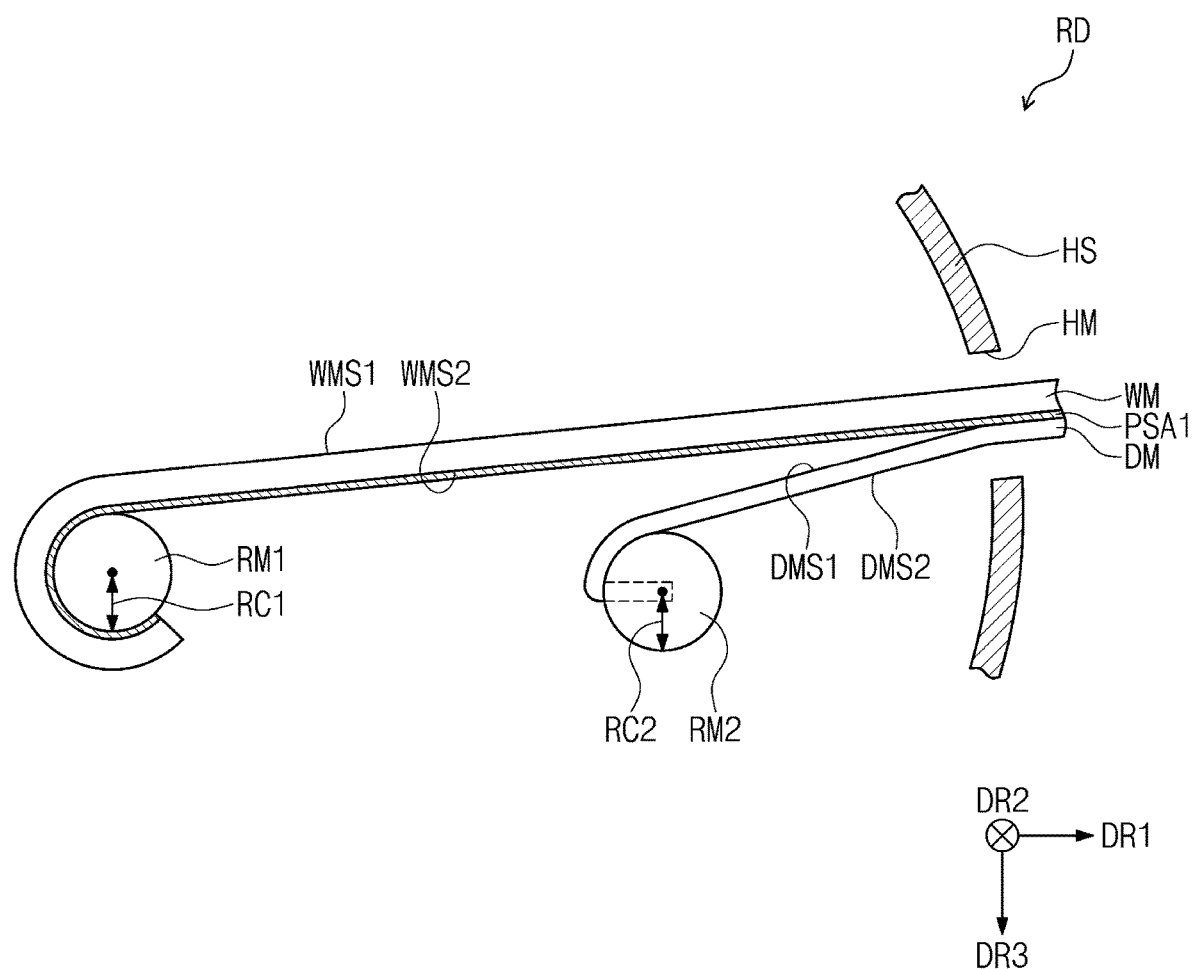
FIG. 3 is a cross-sectional view illustrating a portion of a rollable display device according to an embodiment of the invention.

FIG. 3 is a cross-sectional view illustrating a portion of the rollable display device RD according to an embodiment of the invention. FIG. 3 illustrates a portion of the inside of the housing HS.

Referring to FIG. 3, in an embodiment of the invention, the window member WM and the first pressure sensitive adhesive member PSA1 may be rolled by the first rotation member RM1, and the display module DM may be rolled by the second rotation member RM2.

The window member WM may provide an input surface to a user. The window member WM may have a first window surface WMS1 defined by the first and second directions DR1 and DR2 and a second window surface WMS2 opposite to the first window surface WMS1 in a thickness direction DR3 (herein, referred to as "a third direction DR3"). The input surface may be the first window surface WMS1. In an embodiment, the window member WM may have a thickness of about 50 μm to about 300 μm.

The window member WM may have a single-layered or multi-layered structure. In an embodiment, for example, the window member WM may be provided as a plastic film that includes one selected from the group consisting of polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), poly(arylene ethersulfone), and any combination thereof. However, embodiments of the invention are not limited thereto. In one or more embodiments, the window member WM may be a glass substrate or a sapphire substrate.

In an embodiment, the window member WM may include at least one of a touch screen film or an optical film. For example, the optical film may include a polarizing film, a diffusion film, and/or a protective film. In addition, the window member WM may further include a functional coating layer, such as an anti-fingerprint coating layer or an anti-reflection coating layer.

In an embodiment of the invention, in an unrolled state, a length of the window member WM extending in the first direction DR1 (herein, referred to as "a length of the window member WM") may be greater than a length of the display module DM extending in the first direction DR1 (herein, referred to as "a length of the display module DM").

The first rotation member RM1 may be located under the first pressure sensitive adhesive member PSA1 to roll or wind the window member WM and the first pressure sensitive adhesive member PSA1. The second rotation member RM2 may be located under a second module surface DMS2 of the display module DM to roll or wind the display module DM. The first rotation member RM1 may be further away from the groove HM in the first direction DR1 than the second rotation member RM2.

The first rotation member RM1 may have a first radius RC1, and the second rotation member RM2 may have a second radius RC2. In an embodiment, the first radius RC1 may be equal to the second radius RC2. However, embodiments of the invention are not limited thereto. In another embodiment, the first radius RC1 may be different from the second radius RC2 by a thickness and a modulus of each of the window member WM and the display module DM.

The first pressure sensitive adhesive member PSA1 may be fixed on the second window surface WMS2 of the window member WM. The first pressure sensitive adhesive member PSA1 may be detachable from and attachable to a first module surface DMS1 of the display module DM.

In an embodiment, the first pressure sensitive adhesive member PSA1 may include an acrylic-based adhesive material except a silicone material. In an embodiment, the first pressure sensitive adhesive member PSA1 may have a thickness of about 50 μm to about 100 μm.

For example, the first pressure sensitive adhesive member PSA1 may have an adhesive strength of about 1 gf/inch to about 3 gf/inch when the first pressure sensitive adhesive member PSA1 and the display module DM are separated from each other at a speed of 40 mm/sec by applying a force of 50 N such that an angle therebetween is 180 degrees.

When the window member WM, the first pressure sensitive adhesive member PSA1, and the display module DM enter the housing HS, the first module surface DMS1 may be detached from one surface of the first pressure sensitive adhesive member PSA1 in the housing HS or near the groove HM, and, thus, the window member WM and the display module DM may be spaced apart from each other.

When the window member WM, the first pressure sensitive adhesive member PSA1, and the display module DM exit from the housing HS to the outside of the housing HS, the first module surface DMS1 may be attached to the one surface of the first pressure sensitive adhesive member PSA1 outside the housing HS, and, thus, the window member WM and the display module DM may be integrated with each other as a single body.

According to an embodiment of the invention, the display module DM and the window member WM of the rollable display device RD may be rolled on or may slide on the rotation members RM1 and RM2 different from each other, and, thus, occurrence of buckling and a crack may be reduced or minimized as compared with a case in which the window member WM and the display module DM are rolled on the same rotation member. As a result, reliability of the rollable display device RD may be improved.

Figure 4:
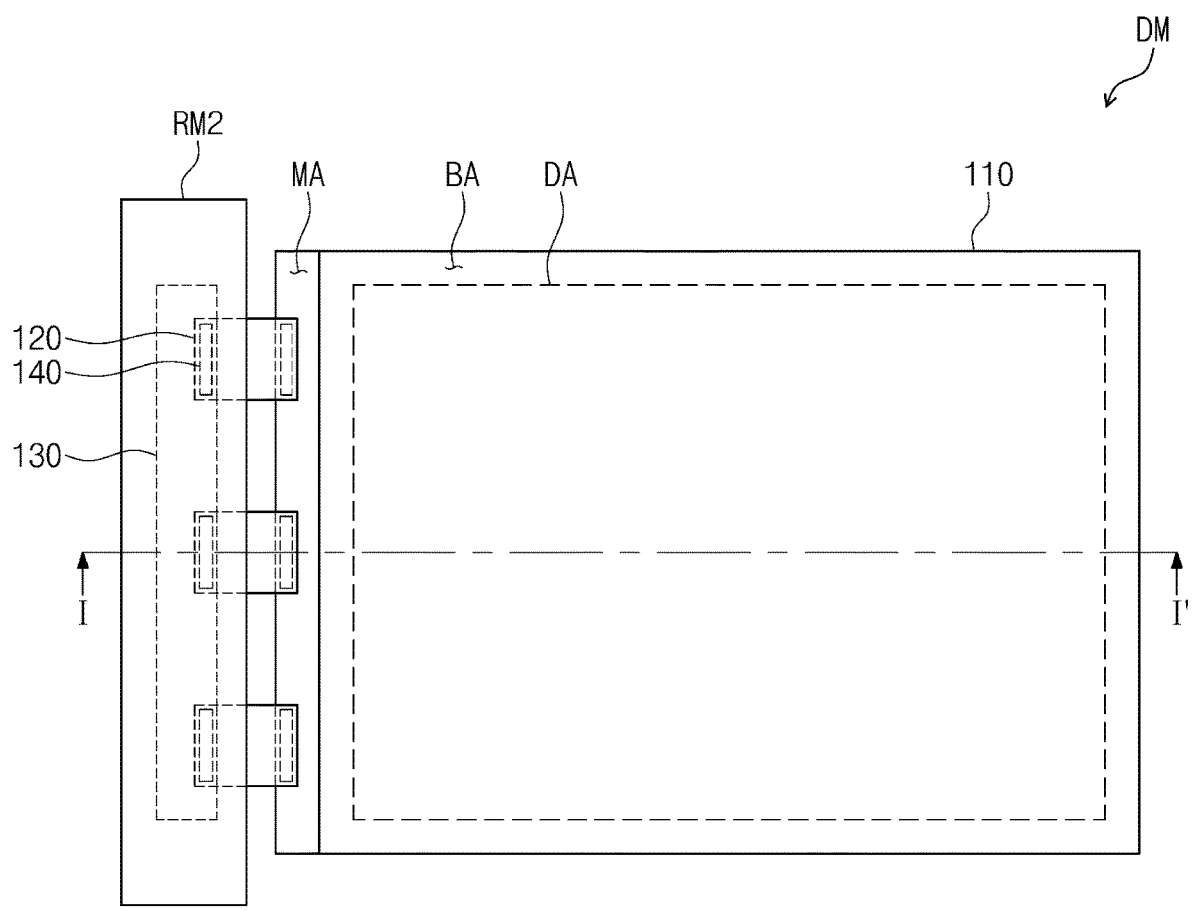
FIG. 4 is a plan view illustrating a portion of a rollable display device according to an embodiment of the invention.
Figure 4:
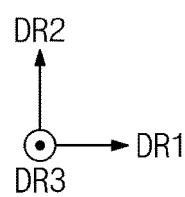
Figure 5:
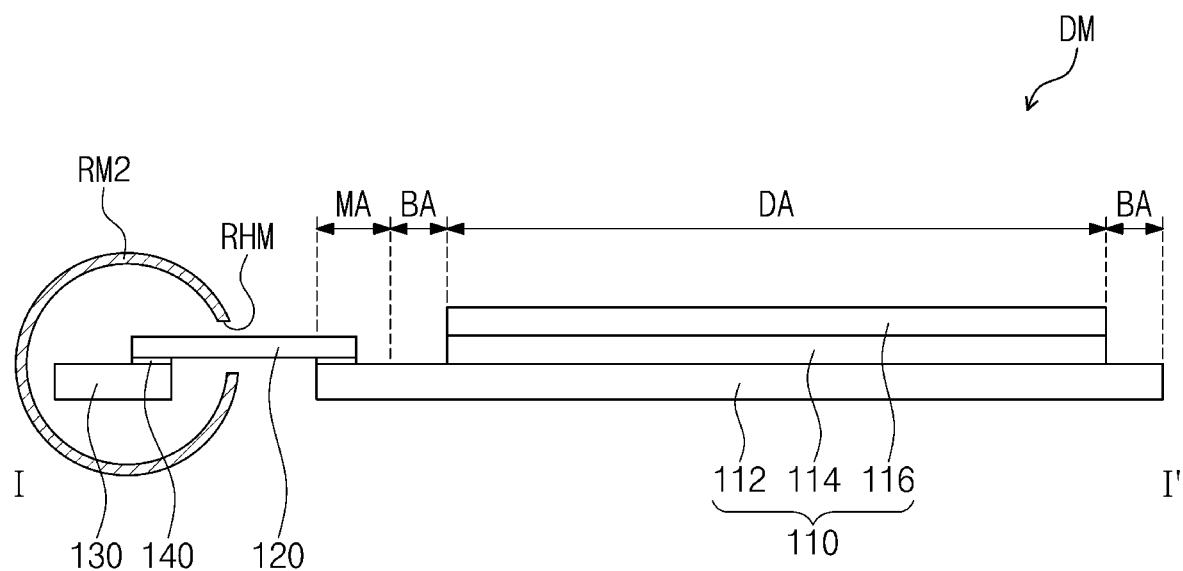
FIG. 5 is a cross-sectional view taken along the line I-I' of FIG. 4 to illustrate a portion of the rollable display device.
Figure 5:
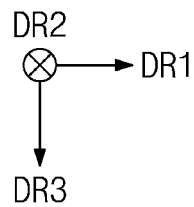

FIG. 4 is a plan view illustrating a portion of a rollable display device according to an embodiment of the invention; and FIG. 5 is a cross-sectional view taken along the line I-I' of FIG. 4 to illustrate a portion of the rollable display device.

Referring to FIGS. 4 and 5, the display module DM may include a display panel 110, a connection substrate 120, and a driving substrate 130.

The display panel 110 may display an image. The display panel 110 may be a liquid crystal display panel, an organic light emitting display panel, or an electrowetting display panel. In the present embodiment, the organic light emitting display panel will be described as an example of the display panel 110.

The display panel 110 may be divided into a display area DA in which an image is displayed, a non-display area BA surrounding the display area DA, and a mounting area MA to which the connection substrate 120 is coupled. In an embodiment of the invention, the non-display area BA and the mounting area MA may not be divided. In other words, the non-display area BA may be omitted or the mounting area MA may be a portion of the non-display area BA.

As illustrated in FIG. 5, the display panel 110 may include a display substrate 112, a display element layer 114 disposed on the display substrate 112, and an encapsulation layer 116 disposed on the display element layer 114.

The display substrate 112 may include a base substrate, and an insulating layer, a functional layer, and a conductive layer disposed on the base substrate. The conductive layer may include gate lines (not shown), data lines (not shown), and other signal lines. In addition, the conductive layer may include pads (not shown) connected to the lines.

The display element layer 114 may include an insulating layer, a functional layer, and a conductive layer. In an embodiment, the functional layer of the display element layer 114 may include an organic light emitting diode.

The encapsulation layer 116 may be disposed on the display element layer 114. The encapsulation layer 116 may protect the display element layer 114. Even though not shown in detail in the drawings, in an embodiment, the encapsulation layer 116 may also cover a side surface of the display element layer 114. In one or more embodiments, the encapsulation layer 116 may be omitted or replaced with another display substrate in accordance with a kind of the display panel 110.

The connection substrate 120 may be provided as a film having flexibility. The connection substrate 120 may be, for example, a flexible printed circuit board (FPCB).

The connection substrate 120 may electrically connect the display panel 110 to the driving substrate 130. In an embodiment, one end of the connection substrate 120 may be electrically connected to the display panel 110 by a conductive adhesive film 140, and another end of the connection substrate 120 may be electrically connected to the driving substrate 130 by a conductive adhesive film 140, and each of the conductive adhesive films 140 may be an anisotropic conductive film (ACF).

The driving substrate 130 may provide image data, a control signal, and a power voltage to the display panel 110. The driving substrate 130 may be a flexible wiring board or a rigid wiring board. In an embodiment, the driving substrate 130 may be a driving circuit. In another embodiment, the driving substrate 130 may be a board on which a driving circuit is mounted.

In an embodiment, when the display panel 110 is rolled or wound on the second rotation member RM2, the driving substrate 130 may be located in the second rotation member RM2. An inner space receiving the driving substrate 130 and at least a portion of the connection substrate 120 may be defined in the second rotation member RM2. An engaging groove RHM with which the connection substrate 120 is engaged may be defined in an area of the second rotation member RM2.

In an embodiment, since the driving substrate 130 is located in the second rotation member RM2, an additional member for covering the driving substrate 130 may be omitted, and an additional member for fixing the display module DM to the second rotation member RM2 may also be omitted.

Figure 6:
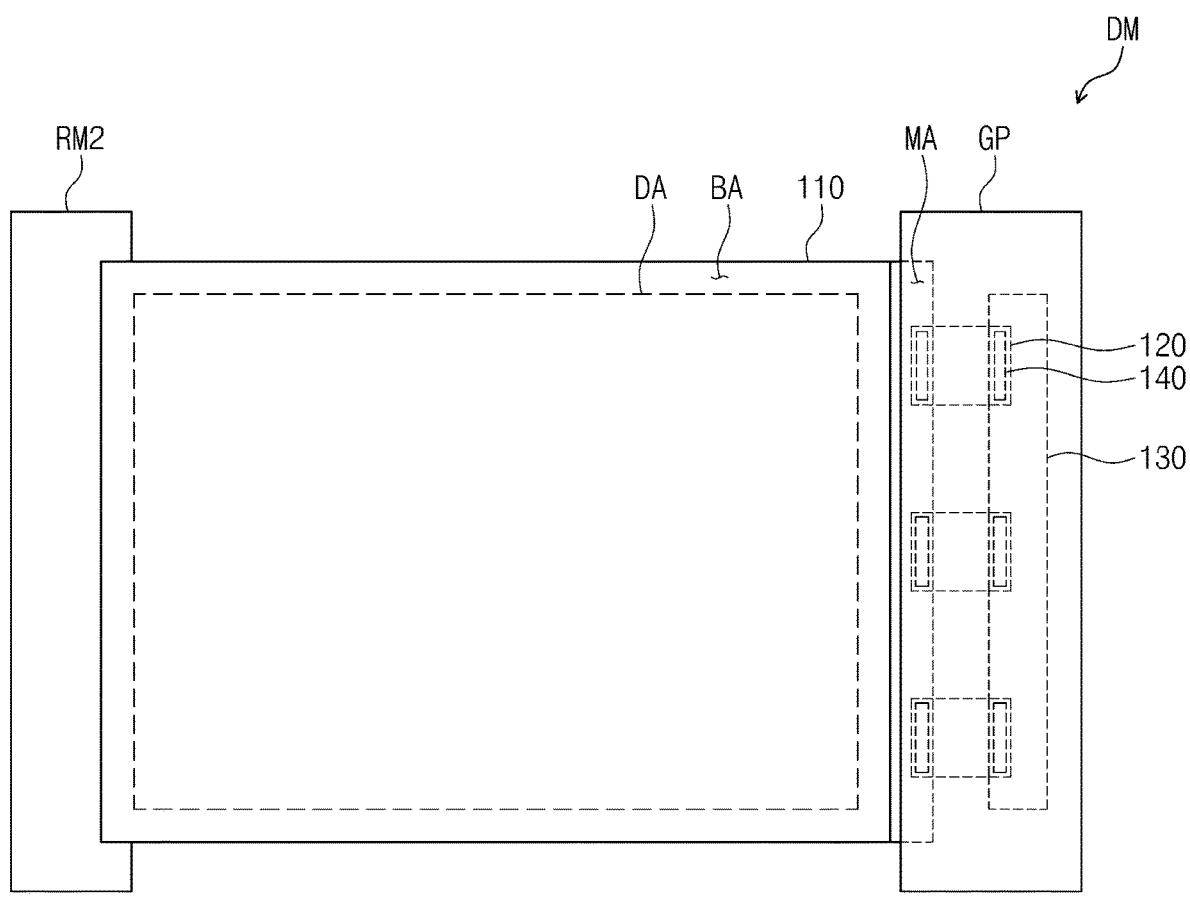
FIG. 6 is a plan view illustrating a portion of a rollable display device according to an embodiment of the invention.

FIG. 6 is a plan view illustrating a portion of a rollable display device according to an embodiment of the invention.

Referring to FIG. 6, the rollable display device RD according to an embodiment of the invention may further include a handle GP coupled to the display module DM. A user may pull the handle GP such that the display module DM and the window member WM are exposed to the outside of the housing HS.

When the display panel 110 is rolled on or slides on the second rotation member RM2, the driving substrate 130 may be located in the handle GP.

Herein, rollable display devices according to some other embodiments of the invention will be described with reference to the drawings. For the purpose of ease and convenience in description, differences between the following embodiments and the above-described embodiments will be mainly described and the same descriptions as in the above-described embodiments will be omitted. In addition, the same components as described above will be indicated by the same reference numerals or the same reference designators, and descriptions thereof will be omitted or mentioned briefly.

Figure 7:
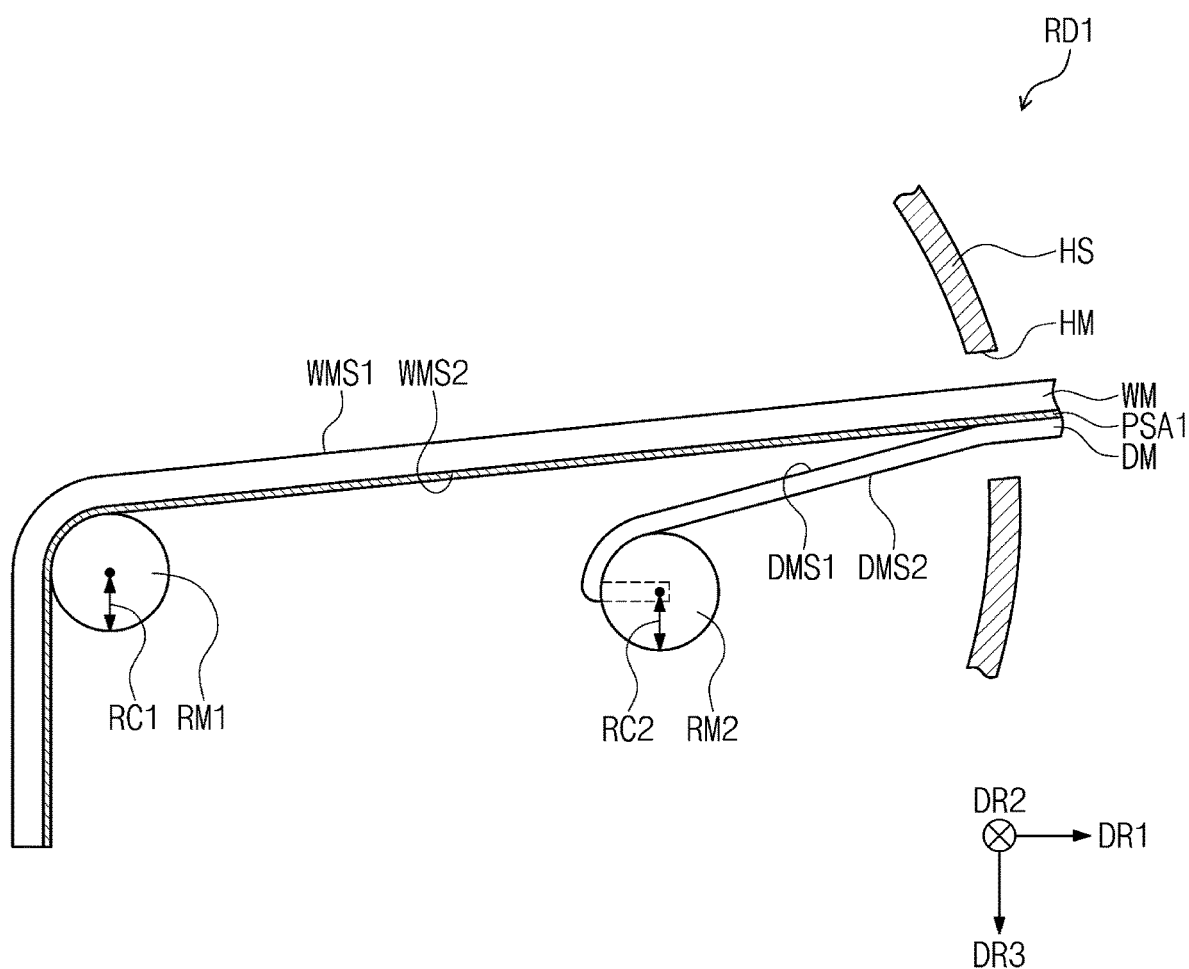
FIGS. 7, 8, 9, 10, and 11 are schematic cross-sectional views illustrating rollable display devices according to some embodiments of the invention.

FIG. 7 is a schematic cross-sectional view illustrating a rollable display device RD1 according to an embodiment of the invention.

Referring to FIG. 7, the first rotation member RM1 may be located under the first pressure sensitive adhesive member PSA1 to slide the window member WM and the first pressure sensitive adhesive member PSA1, and the second rotation member RM2 may be in contact with the second module surface DMS2 of the display module DM to roll or wind the display module DM. Here, the window member WM may be provided as a glass substrate or a sapphire substrate.

In the present embodiment, the window member WM slides by the first rotation member RM1. Thus, even though the window member WM may be provided as a rigid substrate or a rigid film, it is possible to minimize or reduce stress applied to the window member WM when the window member WM enters the housing HS.

Figure 8:
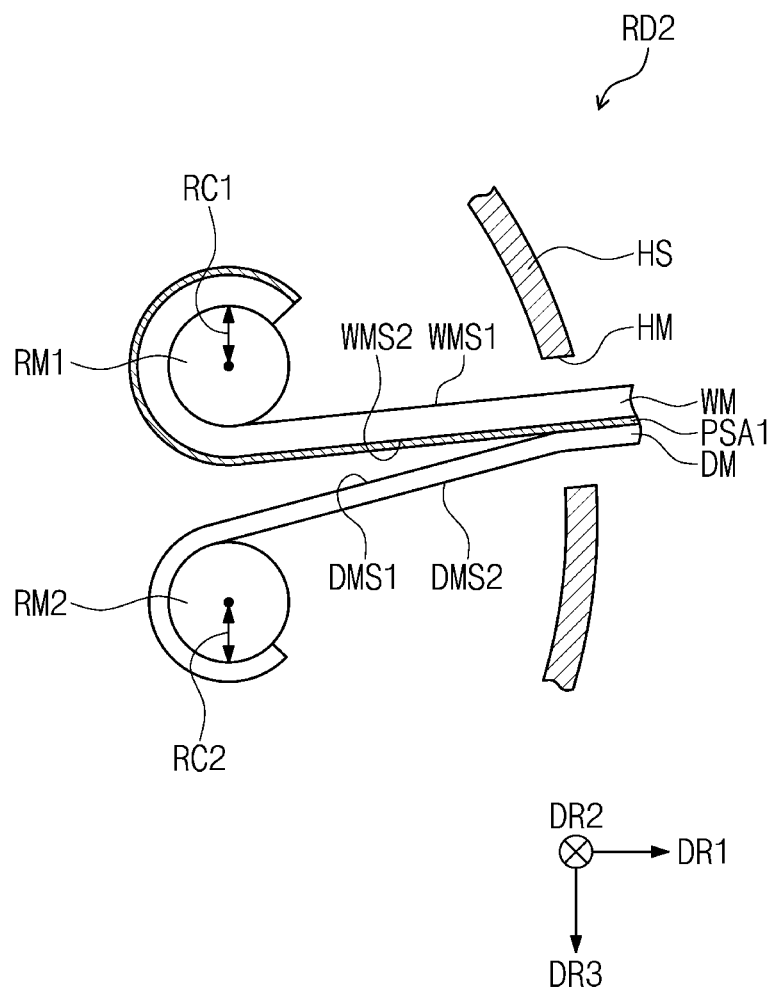

FIG. 8 is a schematic cross-sectional view illustrating a rollable display device RD2 according to an embodiment of the invention.

Referring to FIG. 8, the length of the window member WM may be equal to the length of the display module DM in the present embodiment. The first rotation member RM1 may be located on the first window surface WMS1 of the window member WM to roll or wind the window member WM and the first pressure sensitive adhesive member PSA1. The second rotation member RM2 may be located under the second module surface DMS2 of the display module DM to roll or wind the display module DM.

A distance of the first rotation member RM1 from the groove HM in the first direction DR1 may be equal to a distance of the second rotation member RM2 from the groove HM in the first direction DR1.

Figure 9:
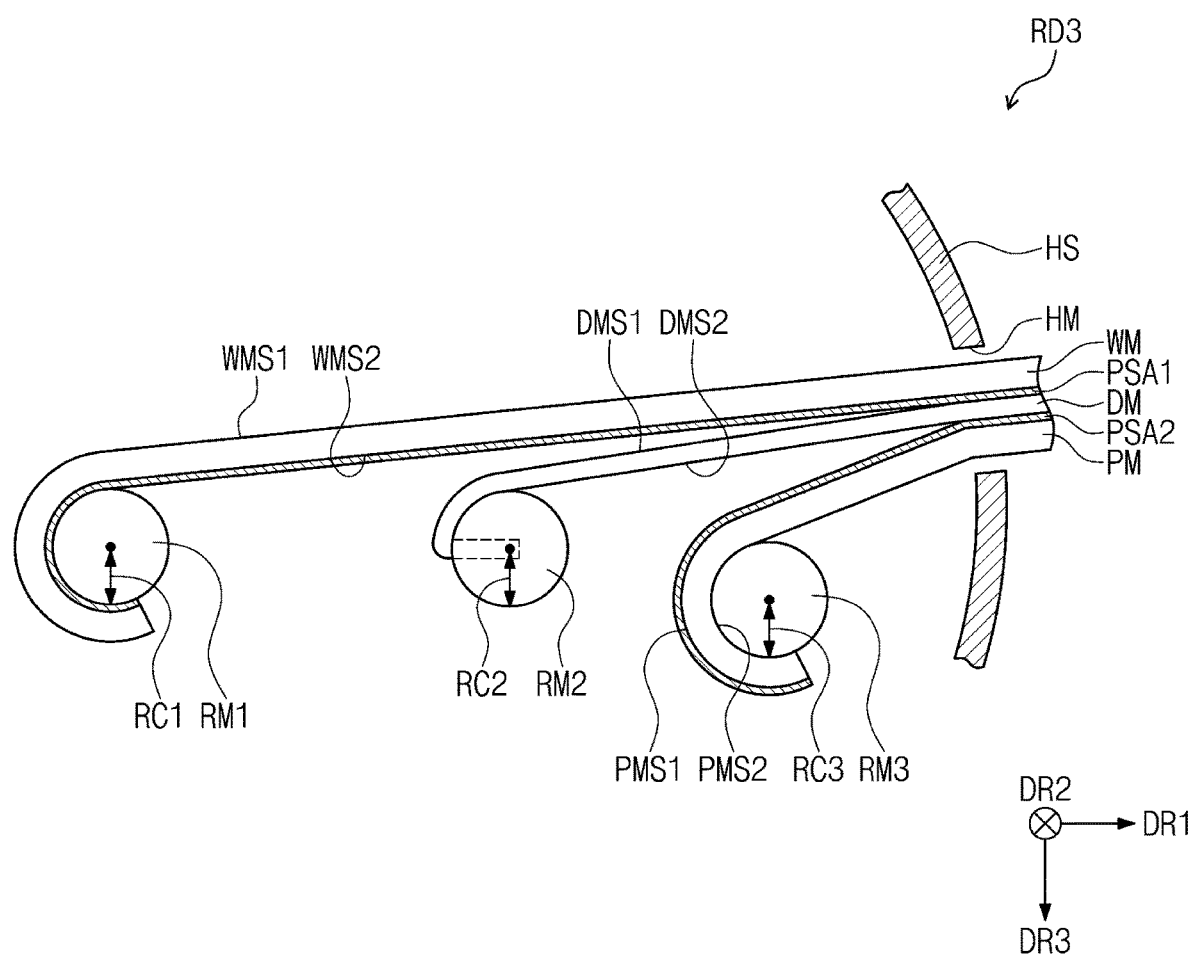

FIG. 9 is a schematic cross-sectional view illustrating a rollable display device RD3 according to an embodiment of the invention.

Referring to FIG. 9, the rollable display device RD3 according to an embodiment of the invention may further include a protective member PM, a second pressure sensitive adhesive member PSA2, and a third rotation member RM3. The protective member PM and the second pressure sensitive adhesive member PSA2 may be rolled by the third rotation member RM3.

The protective member PM may have a first protective surface PMS1 and a second protective surface PMS2, which are opposite to each other in the third direction DR3. The first protective surface PMS1 may face the second module surface DMS2 and may be disposed between the second protective surface PMS2 and the second module surface DMS2. In an embodiment, the protective member PM may have a thickness of about 50 μm to about 300 μm.

The protective member PM may be disposed under the display module DM to protect the display module DM. In an embodiment, for example, the protective member PM may be provided as a plastic film that includes one selected from the group consisting of polyethersulfone (PES), polyacrylate, polyetherimide (PEI), polyethylene naphthalate (PEN), polyethylene terephthalate (PET), polyphenylene sulfide (PPS), polyarylate, polyimide (PI), polycarbonate (PC), poly(arylene ethersulfone), and any combination thereof. However, embodiments of the invention are not limited thereto. In one or more embodiments, the protective member PM may be provided as a metal film. In one or more embodiments, the protective member PM may include an optical film, such as a polarizing film, a diffusion film, and/or a protective film.

According to an embodiment of the invention, the length of the display module DM may be less than the length of the window member WM, in the unrolled state. In addition, a length of the protective member PM extending in the first direction DR1 (herein, referred to as "a length of the protective member PM") may be less than the length of the display module DM, in the unrolled state.

The first rotation member RM1 may be located under the first pressure sensitive adhesive member PSA1 to roll the window member WM and the first pressure sensitive adhesive member PSA1. The second rotation member RM2 may be located under the second module surface DMS2 of the display module DM to roll the display module DM. The third rotation member RM3 may be located under the second protective surface PMS2 of the protective member PM to roll or wind the protective member PM and the second pressure sensitive adhesive member PSA2.

The third rotation member RM3 may have a third radius RC3. In an embodiment, the third radius RC3 may be equal to the first radius RC1 of the first rotation member RM1 and the second radius RC2 of the second rotation member RM2. However, embodiments of the invention are not limited thereto. In another embodiment, the first radius RC1, the second radius RC2, and the third radius RC3 may be different from each other in accordance with thicknesses and modulus of the window member WM, the display module DM, and the protective member PM.

The first rotation member RM1 may be farther away from the groove HM in the first direction DR1 than the second rotation member RM2, and the second rotation member RM2 may be farther away from the groove HM in the first direction DR1 than the third rotation member RM3.

The second pressure sensitive adhesive member PSA2 may be fixed on the first protective surface PMS1 of the protective member PM. The second pressure sensitive adhesive member PSA2 may be detachable from and attachable to the second module surface DMS2 of the display module DM.

In an embodiment, the second pressure sensitive adhesive member PSA2 may include an acrylic-based adhesive material except a silicone material. In an embodiment, the second pressure sensitive adhesive member PSA2 may have a thickness of about 50 μm to about 100 μm.

For example, the second pressure sensitive adhesive member PSA2 may have an adhesive strength of about 1 gf/inch to about 3 gf/inch when the second pressure sensitive adhesive member PSA2 and the display module DM are separated from each other at a speed of 40 mm/sec by applying a force of 50 N such that an angle therebetween is 180 degrees.

When the window member WM, the first pressure sensitive adhesive member PSA1, the display module DM, the second pressure sensitive adhesive member PSA2, and the protective member PM enter the housing HS, the second module surface DMS2 may be detached from one surface of the second pressure sensitive adhesive member PSA2 in the housing HS or near the groove HM, and, thus, the protective member PM and the display module DM may be spaced apart from each other.

When the window member WM, the first pressure sensitive adhesive member PSA1, the display module DM, the second pressure sensitive adhesive member PSA2, and the protective member PM exit to the outside of the housing HS, the second module surface DMS2 may be attached to the one surface of the second pressure sensitive adhesive member PSA2 outside the housing HS or near the groove HM, and, thus, the protective member PM and the display module DM may be integrated with each other as a single body.

Figure 10:
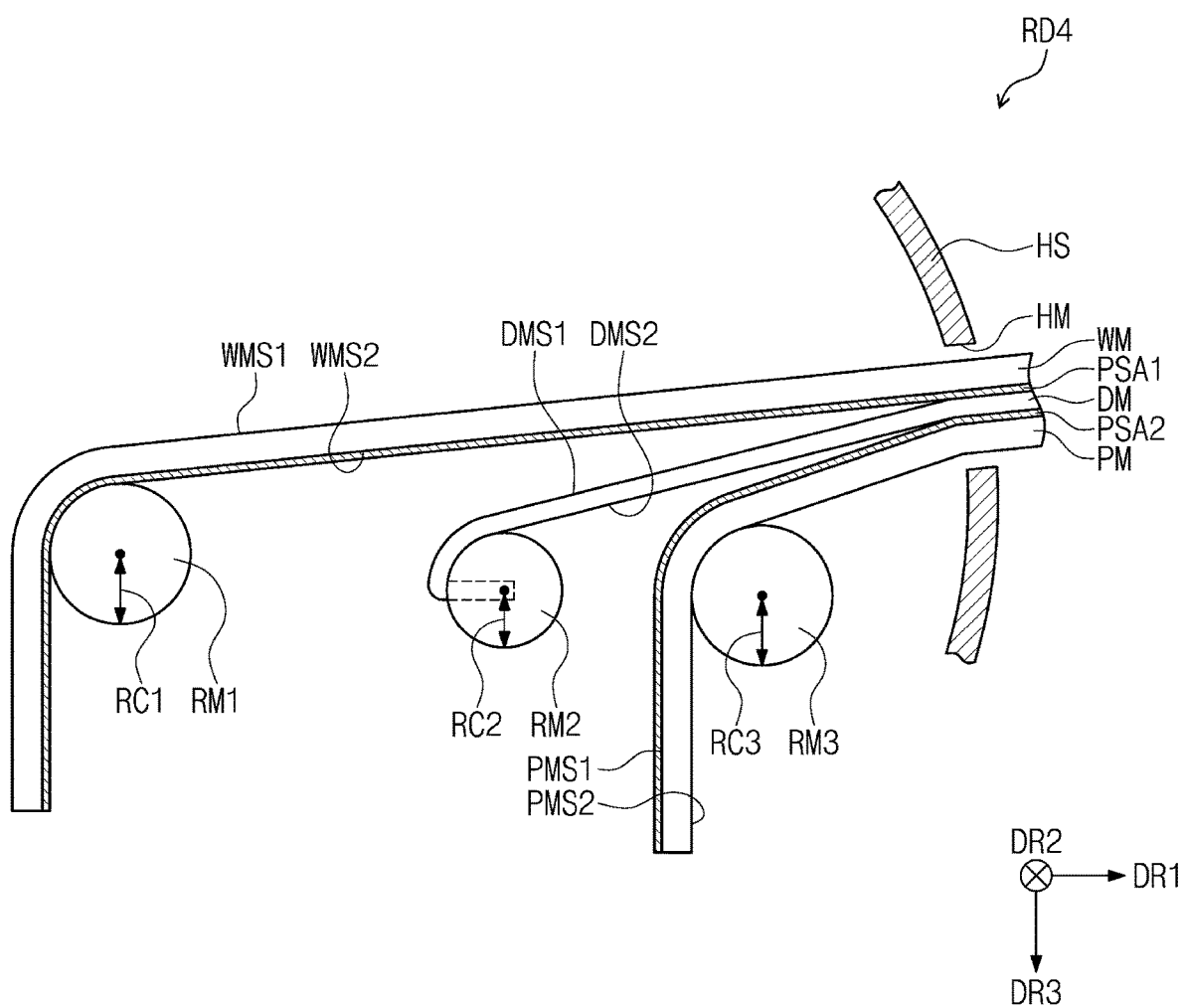

FIG. 10 is a schematic cross-sectional view illustrating a rollable display device RD4 according to an embodiment of the invention.

Referring to FIG. 10, the first rotation member RM1 may be located under the first pressure sensitive adhesive member PSA1 to slide the window member WM and the first pressure sensitive adhesive member PSA1, and the third rotation member RM3 may be located under the protective member PM to slide the protective member PM and the second pressure sensitive adhesive member PSA2. The second rotation member RM2 may be in contact with the second module surface DMS2 of the display module DM to roll or wind the display module DM. In an embodiment, although not shown in the drawings, the second rotation member RM2 may be in contact with the second module surface DMS2 of the display module DM and may slide the display module DM.

In an embodiment, the first radius RC1 of the first rotation member RM1 and the third radius RC3 of the third rotation member RM3 may be greater than the second radius RC2 of the second rotation member RM2.

In the present embodiment, the protective member PM slides by the third rotation member RM3. Thus, even though the protective member PM may be provided as a rigid substrate or a rigid film, it is possible to minimize or reduce stress applied to the protective member PM when the protective member PM enters the housing HS.

Figure 11:
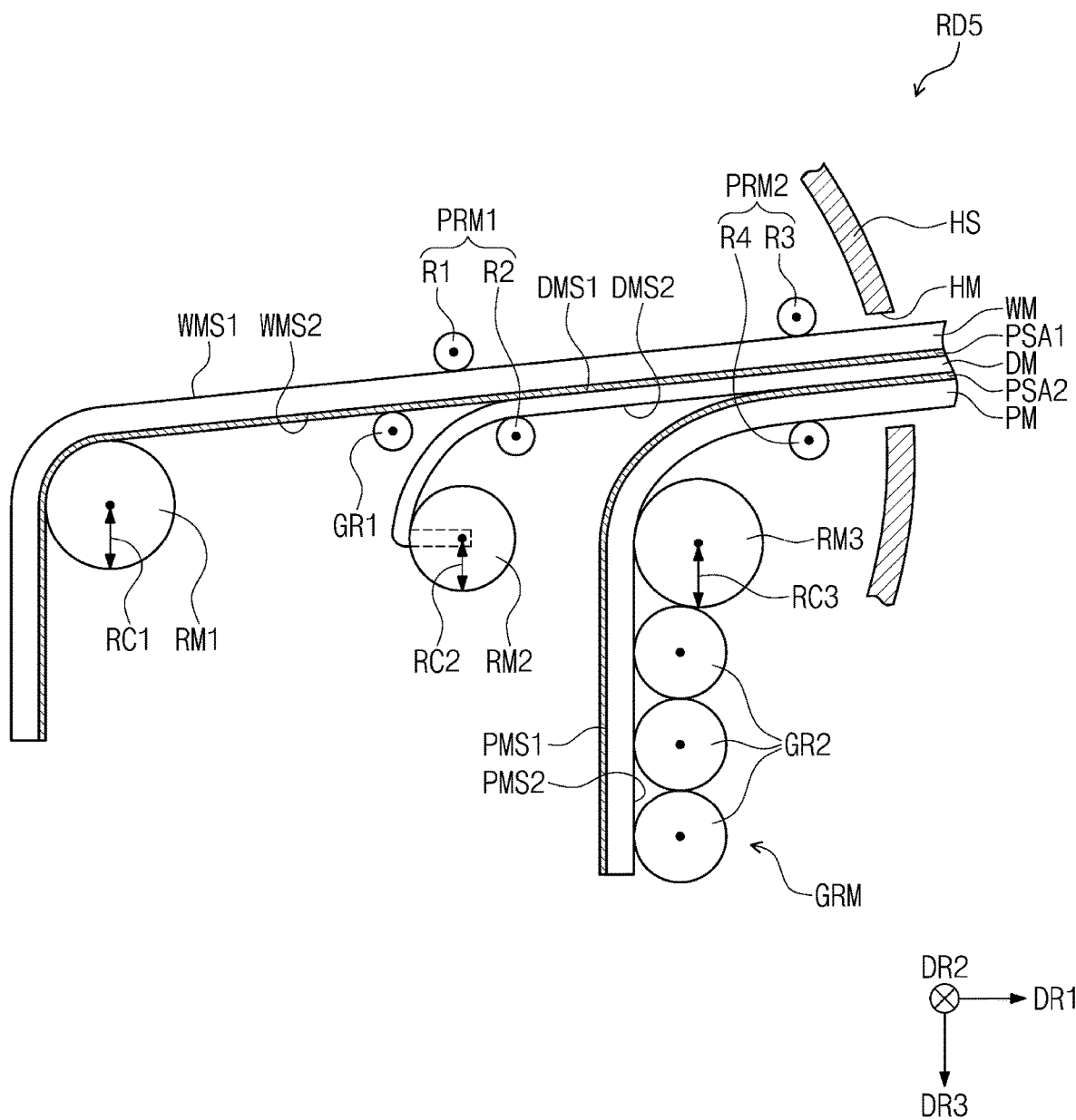

FIG. 11 is a schematic cross-sectional view illustrating a rollable display device RD5 according to an embodiment of the invention.

Referring to FIG. 11, the rollable display device RD5 according to an embodiment of the invention may further include a first pressing rotation member PRM1, a second pressing rotation member PRM2, and a guide rotation member GRM, which are disposed in the housing HS.

The first pressing rotation member PRM1 may include a first roller R1 and a second roller R2, which are provided to integrate the window member WM and the display module DM.

The first roller R1 may be disposed on the window member WM to press the first window surface WMS1 of the window member WM. The second roller R2 may be disposed under the display module DM to press the second module surface DMS2 of the display module DM.

When the window member WM, the first pressure sensitive adhesive member PSA1, the display module DM, the second pressure sensitive adhesive member PSA2 and the protective member PM exit from the housing HS, the first roller R1 and the second roller R2 may press the window member WM and the display module DM, respectively. Thus, the first module surface DMS1 of the display module DM may be easily attached to one surface of the first pressure sensitive adhesive member PSA1.

The second pressing rotation member PRM2 may be disposed adjacent to the groove HM of the housing HS and may include a third roller R3 and a fourth roller R4 which are provided to integrate the window member WM and the display module DM, which are integrated with each other, with the protective member PM.

The third roller R3 may be disposed on the window member WM to press the first window surface WMS1 of the window member WM. The fourth roller R4 may be disposed under the protective member PM to press the second protective surface PMS2 of the protective member PM.

When the window member WM, the first pressure sensitive adhesive member PSA1, the display module DM, the second pressure sensitive adhesive member PSA2, and the protective member PM exit from the housing HS, the third roller R3 and the fourth roller R4 may press the window member WM and the protective member PM, respectively. Thus, the second module surface DMS2 of the display module DM may be easily attached to one surface of the second pressure sensitive adhesive member PSA2.

The guide rotation member GRM may include a first guide roller GR1 and a second guide roller GR2.

The first guide roller GR1 may be located between the first rotation member RM1 and the second rotation member RM2 and may be disposed under the window member WM. The first guide roller GR1 may guide the window member WM, detached from the display module DM, to the first rotation member RM1. In addition, the first guide roller GR1 may prevent or substantially prevent the window member WM from sagging or being deformed before the window member WM is rolled on or slides on the first rotation member RM1.

The second guide roller GR2 may be disposed under the protective member PM and may be located in parallel to the third rotation member RM3. The second guide roller GR2 may be provided in plurality and may support the sliding protective member PM.

Figure 12:
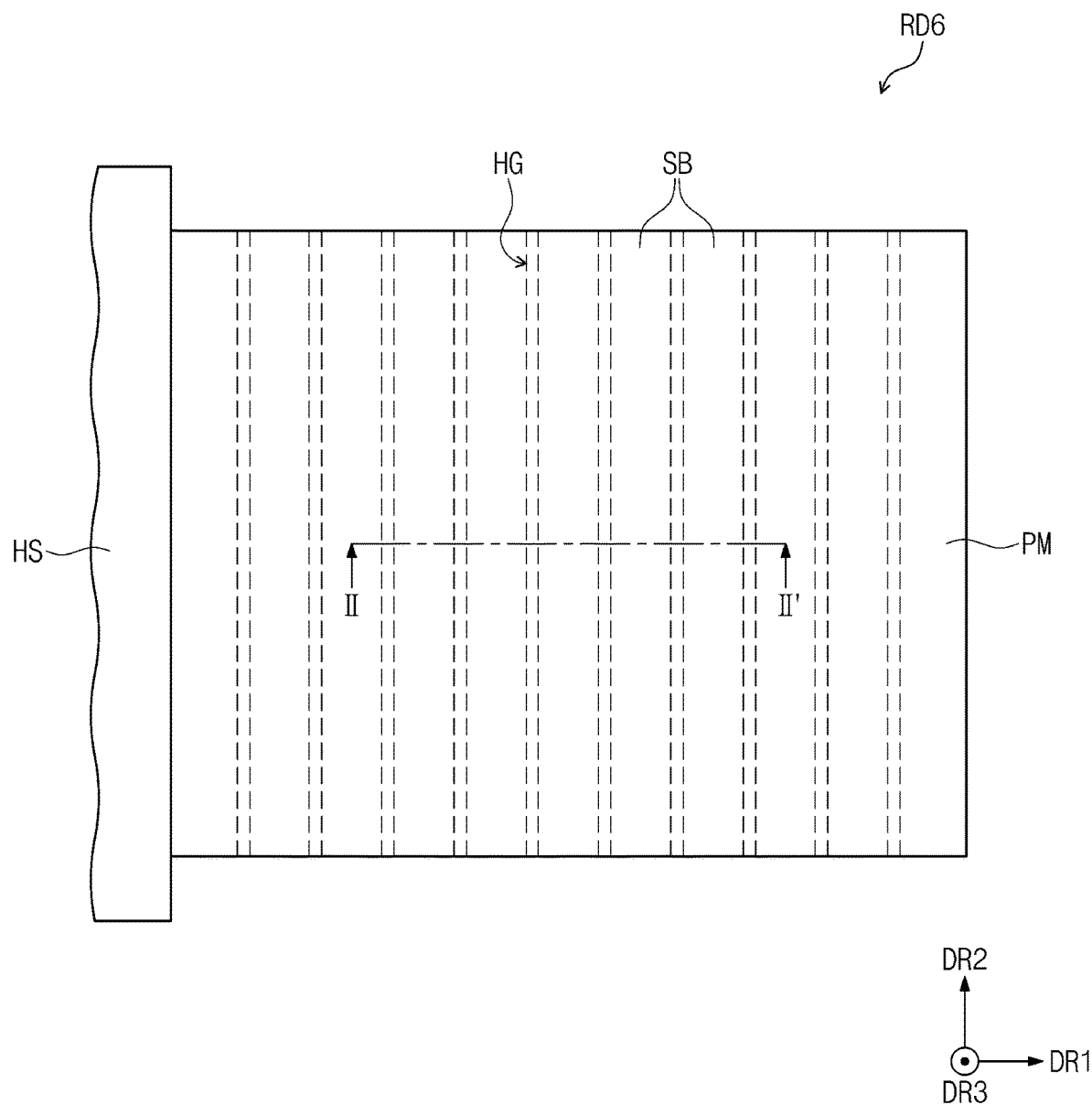
FIG. 12 is a plan view illustrating a portion of a rollable display device according to an embodiment of the invention.
Figure 13:
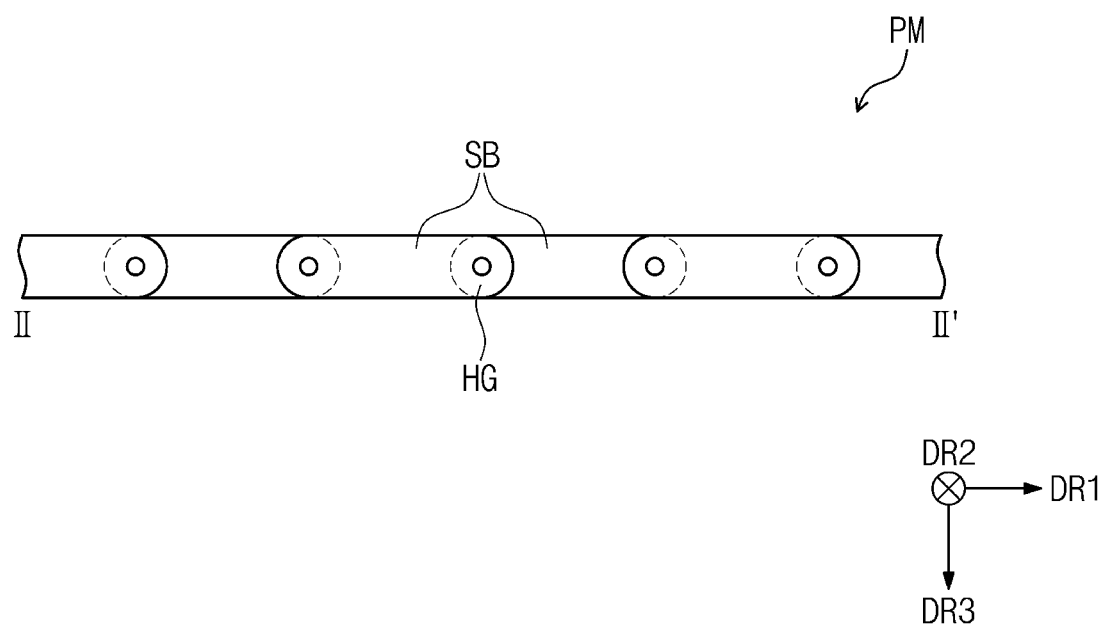
FIG. 13 is a cross-sectional view taken along the line II-II' of FIG. 12 to illustrate a portion of the rollable display device.

FIG. 12 is a plan view illustrating a portion of a rollable display device RD6 according to an embodiment of the invention; and FIG. 13 is a cross-sectional view taken along the line II-II' of FIG. 12 to illustrate a portion of the rollable display device RD6. FIG. 13 illustrates only a cross section of a protective member PM for the purpose of ease and convenience in description and illustration.

Referring to FIGS. 12 and 13, the protective member PM may include a plurality of supporting blocks SB extending in the second direction DR2 and arranged in the first direction DR1. Supporting blocks adjacent to each other of the supporting blocks SB may have joint structures connected to each other by a hinge HG.

In an embodiment, the protective member PM may include a metal material. Thus, the protective member PM may prevent or substantially prevent the display module DM from being damaged by an external impact. In addition, the protective member PM may firmly support the display module DM to prevent or substantially prevent the display module DM from sagging or being deformed while the display module DM provides an image.

Figure 14:
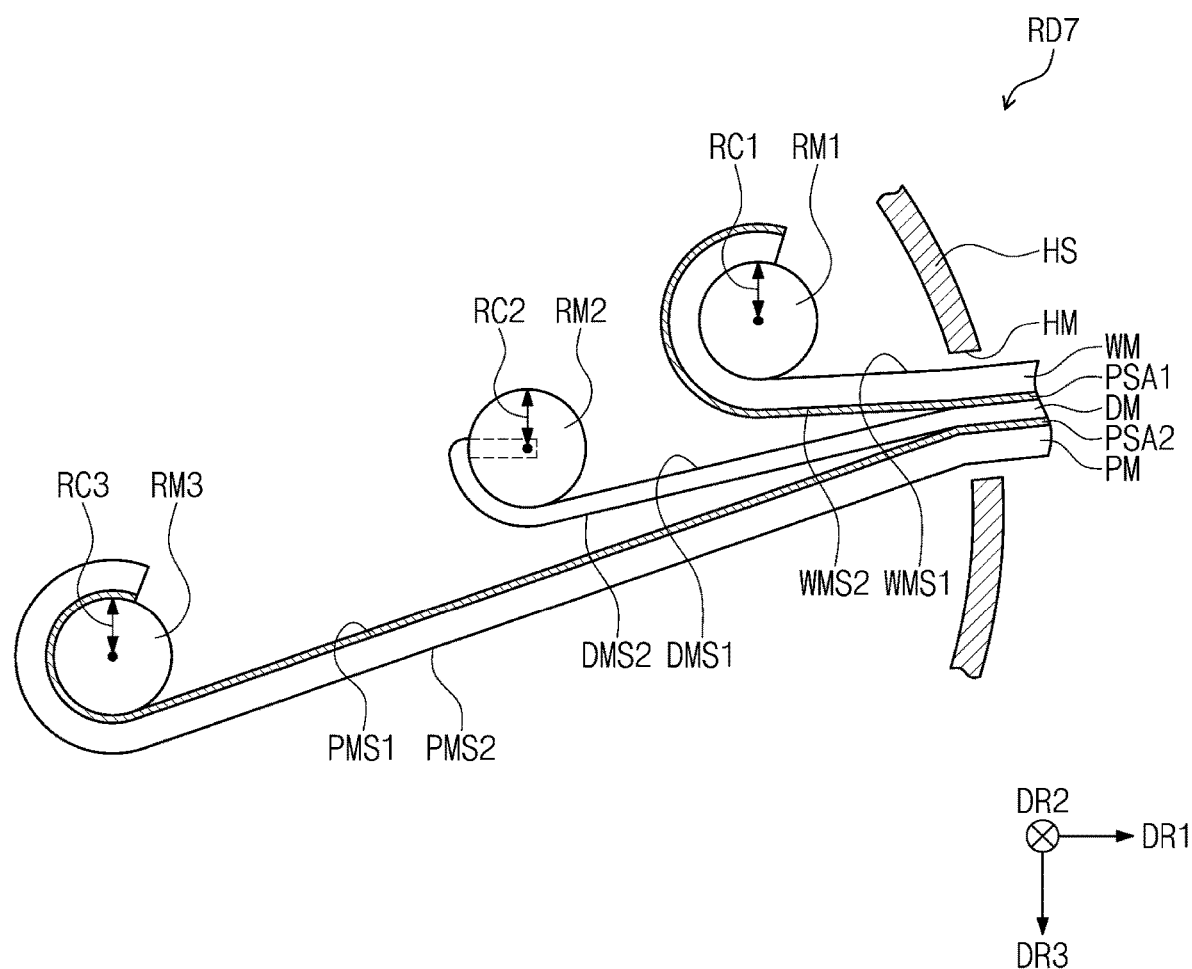
FIGS. 14, 15, 16, and 17 are schematic cross-sectional views illustrating rollable display devices according to some embodiments of the invention.

FIG. 14 is a schematic cross-sectional view illustrating a rollable display device RD7 according to an embodiment of the invention.

Referring to FIG. 14, in the unrolled state, the length of the display module DM may be greater than the length of the window member WM, and the length of the protective member PM may be greater than the length of the display module DM.

The first rotation member RM1 may be located on the window member WM to roll the window member WM and the first pressure sensitive adhesive member PSA1. The second rotation member RM2 may be located on the first module surface DMS1 of the display module DM to roll the display module DM. The third rotation member RM3 may be located on the first protective surface PMS1 of the protective member PM (i.e., on the second pressure sensitive adhesive member PSA2) to roll the protective member PM and the second pressure sensitive adhesive member PSA2.

However, embodiments of the invention are not limited thereto. For example, in one or more embodiments, the first rotation member RM1 may slide the window member WM and the first pressure sensitive adhesive member PSA1, and the second rotation member RM2 may slide the display module DM. In addition, the third rotation member RM3 may slide the protective member PM and the second pressure sensitive adhesive member PSA2.

The first rotation member RM1 may be closer to the groove HM in the first direction DR1 than the second rotation member RM2, and the second rotation member RM2 may be closer to the groove HM in the first direction DR1 than the third rotation member RM3.

Figure 15:
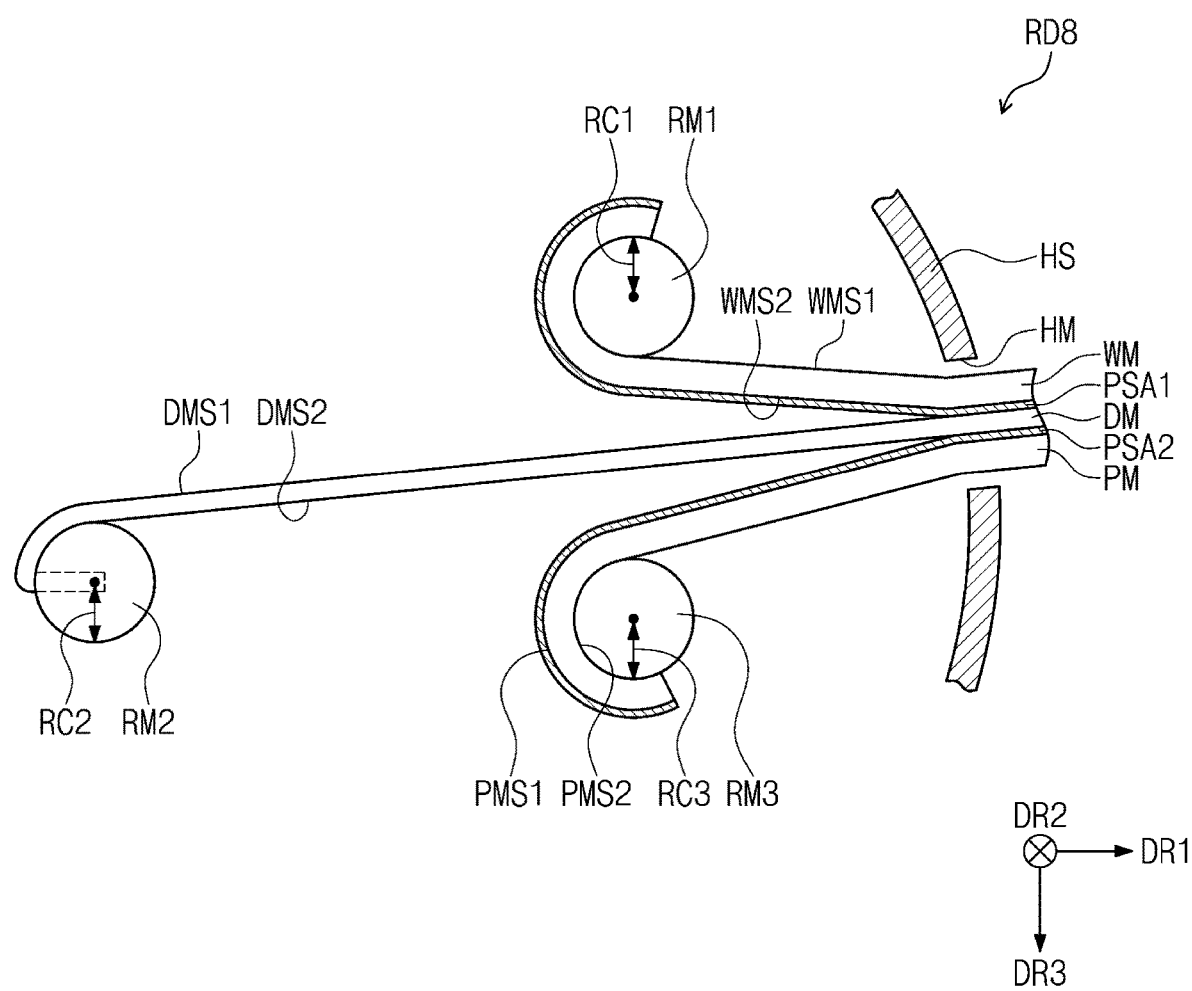

FIG. 15 is a schematic cross-sectional view illustrating a rollable display device RD8 according to an embodiment of the invention.

In the unrolled state, the length of the display module DM may be greater than the length of the window member WM, and the length of the protective member PM may be less than the length of the display module DM.

The first rotation member RM1 may be located on the window member WM to roll the window member WM and the first pressure sensitive adhesive member PSA1. The second rotation member RM2 may be located on the first module surface DMS1 or under the second module surface DMS2 of the display module DM to roll the display module DM. The third rotation member RM3 may be located under the second protective surface PMS2 of the protective member PM to roll the protective member PM and the second pressure sensitive adhesive member PSA2.

However, embodiments of the invention are not limited thereto. For example, in one or more embodiments, the first rotation member RM1 may slide the window member WM and the first pressure sensitive adhesive member PSA1, and the second rotation member RM2 may slide the display module DM. In addition, the third rotation member RM3 may slide the protective member PM and the second pressure sensitive adhesive member PSA2.

The first rotation member RM1 may be closer to the groove HM in the first direction DR1 than the second rotation member RM2, and the second rotation member RM2 may be farther away from the groove HM in the first direction DR1 than the third rotation member RM3.

Figure 16:
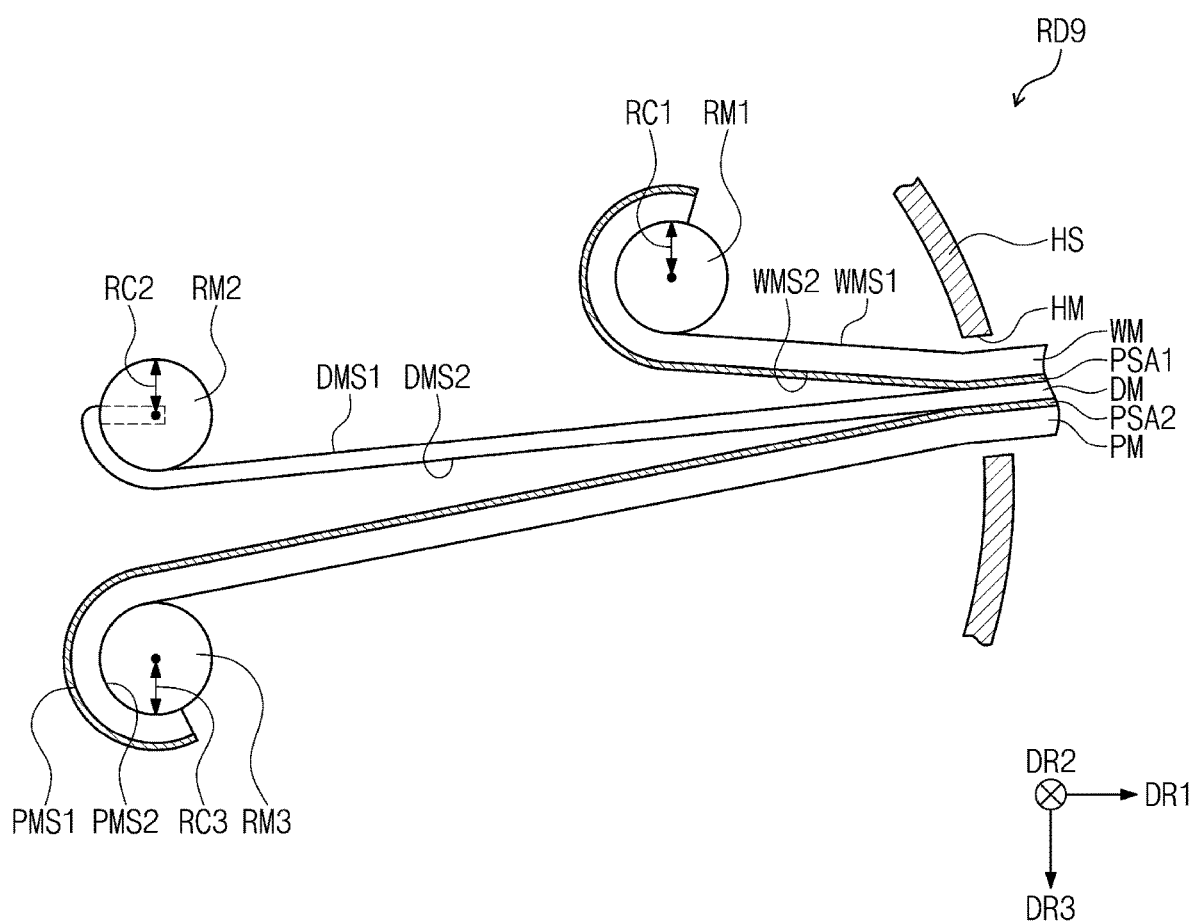

FIG. 16 is a schematic cross-sectional view illustrating a rollable display device RD9 according to an embodiment of the invention.

Referring to FIG. 16, in the unrolled state, the length of the display module DM may be greater than the length of the window member WM and may be equal to the length of the protective member PM.

The first rotation member RM1 may be located on the window member WM to roll the window member WM and the first pressure sensitive adhesive member PSA1. The second rotation member RM2 may be located on the first module surface DMS1 of the display module DM to roll the display module DM. The third rotation member RM3 may be located under the second protective surface PMS2 of the protective member PM to roll the protective member PM and the second pressure sensitive adhesive member PSA2.

However, embodiments of the invention are not limited thereto. For example, in one or more embodiments, the first rotation member RM1 may slide the window member WM and the first pressure sensitive adhesive member PSA1, and the second rotation member RM2 may slide the display module DM. In addition, the third rotation member RM3 may slide the protective member PM and the second pressure sensitive adhesive member PSA2.

The first rotation member RM1 may be closer to the groove HM in the first direction DR1 than the second rotation member RM2. A distance of the second rotation member RM2 from the groove HM in the first direction DR1 may be equal to a distance of the third rotation member RM3 from the groove HM in the first direction DR1.

Figure 17:
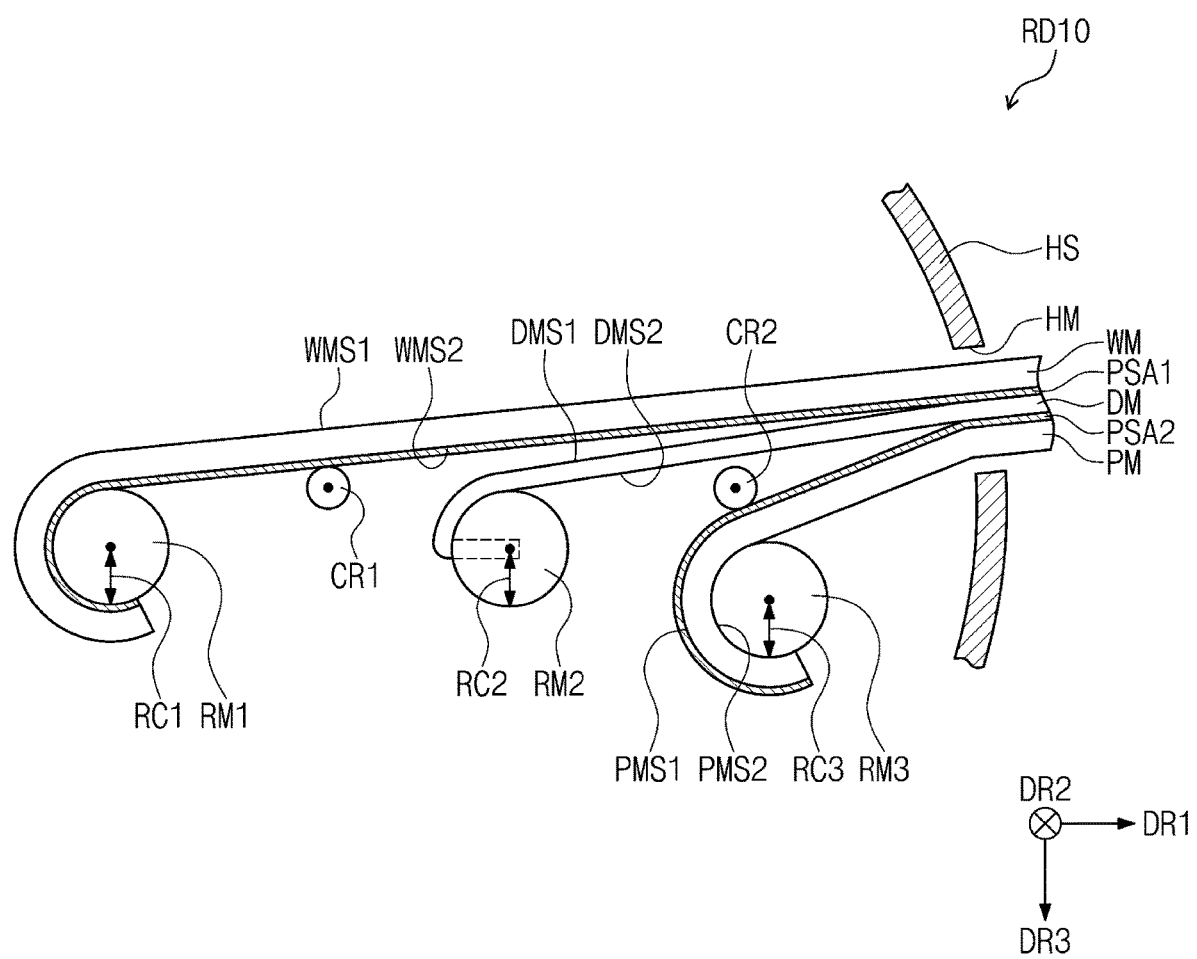

FIG. 17 is a schematic cross-sectional view illustrating a rollable display device RD10 according to an embodiment of the invention.

Referring to FIG. 17, the rollable display device RD10 according to an embodiment of the invention may further include a first cleaning rotation member CR1 and a second cleaning rotation member CR2, which are disposed in the housing HS. The first cleaning rotation member CR1 and the second cleaning rotation member CR2 may be spaced apart from each other.

The first cleaning rotation member CR1 may be located under the first pressure sensitive adhesive member PSA1 and may remove a foreign material attached to the first pressure sensitive adhesive member PSA1 when the first pressure sensitive adhesive member PSA1 and the display module DM are detached from each other.

The second cleaning rotation member CR2 may be located on the second pressure sensitive adhesive member PSA2 and may remove a foreign material attached to the second pressure sensitive adhesive member PSA2 when the second pressure sensitive adhesive member PSA2 and the display module DM are detached from each other.

In the present embodiment, the first and second cleaning rotation members CR1 and CR2 have roller shapes. In another embodiment, the first and second cleaning rotation members CR1 and CR2 may have brush shapes or plate shapes. However, the shapes of the first and second cleaning rotation members CR1 and CR2 are not limited to a specific shape.

Figure 18:
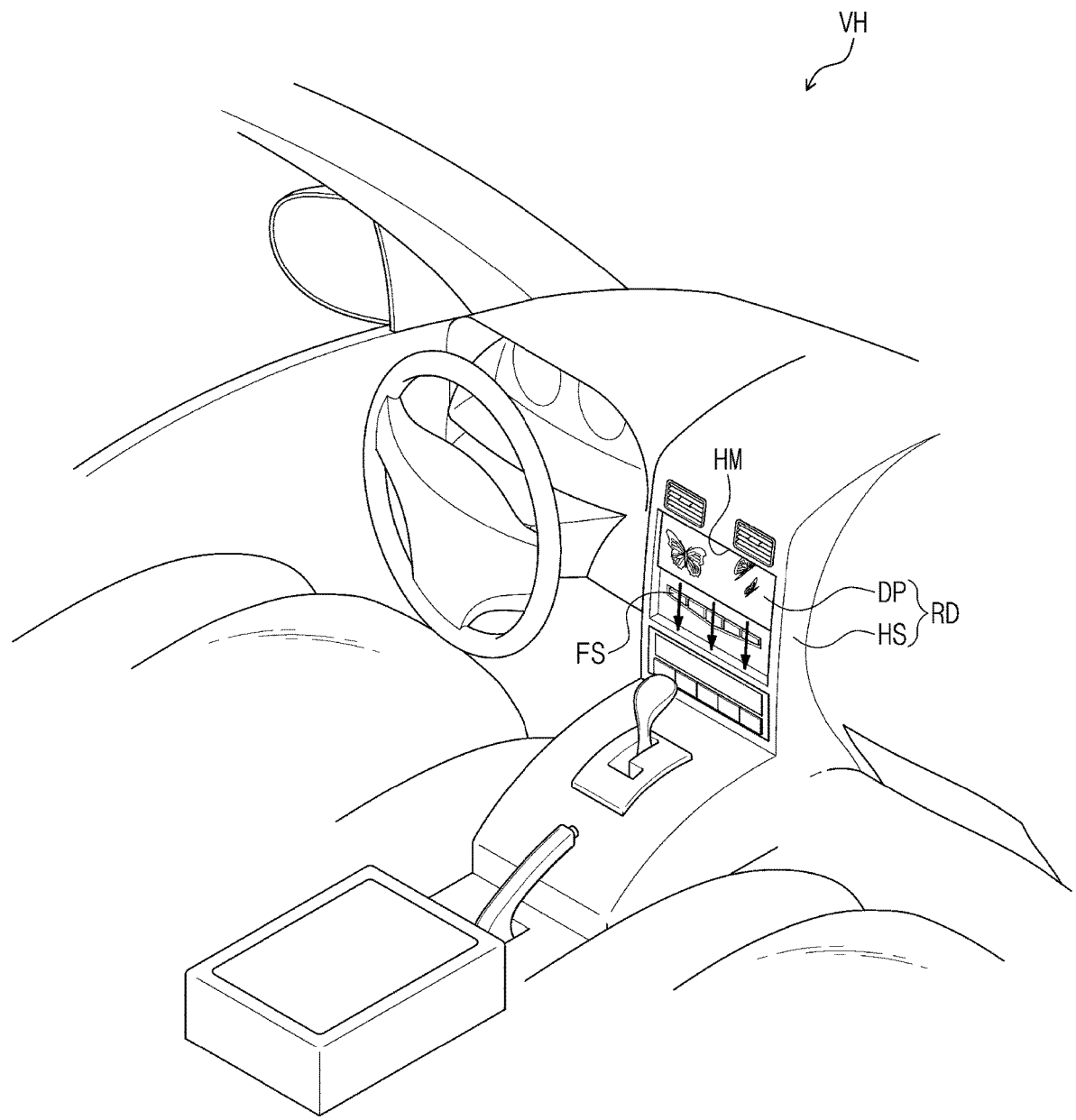
FIG. 18 is a schematic perspective view illustrating an inside of a vehicle in which a rollable display device according to an embodiment of the invention is installed.

FIG. 18 is a schematic perspective view illustrating an inside of a vehicle VH in which a rollable display device RD according to an embodiment of the invention is installed.

Referring to FIG. 18, the rollable display device RD may be installed in the vehicle VH to provide an image to a driver. The window member WM, the first pressure sensitive adhesive member PSA1 and the display module DM (herein, referred to as "a display part DP") may enter the housing HS installed in the vehicle VH or may exit from the housing HS to the outside of the housing HS.

An area of the display part DP exiting from the housing HS may be changed according to the convenience of a user. When a user is provided with an image through the display part DP, the whole of the display area DA (see FIG. 4) of the display part DP may exit to the outside of the housing HS. When a user is provided with a portion of an image through the display part DP or is not provided with an image, only a portion of the display part DP may be exposed to the outside of the housing HS or the whole of the display part DP may enter the housing HS. At this time, a separate functional sensor tool FS may be located under the display part DP. Since the area of the display part DP is changeable, a space in which the display part DP is installed may be saved or reduced.

According to embodiments of the invention, the display module and the window member of the rollable display device are rolled on different rotation members from each other. In this case, occurrence of buckling or a crack may be reduced or minimized as compared with a case in which the window member and the display module are rolled on the same rotation member, and, thus, reliability of the rollable display device may be improved.

While the invention has been described with reference to some example embodiments, it will be apparent to those skilled in the art that various changes and modifications may be made without departing from the spirit and scope of the invention. Therefore, it is to be understood that the above embodiments are not limiting, but illustrative. Thus, the scope of the invention is to be determined by the broadest permissible interpretation of the following claims and their equivalents, and shall not be restricted or limited by the foregoing description.

What is claimed is:

1. A rollable display device comprising:
   a window member including a first window surface defined by a first direction and a second direction, and a second window surface opposite to the first window surface in a thickness direction;
   a first pressure sensitive adhesive member fixed on the second window surface;
   a display module facing the window member with the first pressure sensitive adhesive member arranged therebetween, the display module including a first module surface detachable from and attachable to the first pressure sensitive adhesive member; and a second module surface opposite to the first module surface;
   a housing having a groove through which the window member, the first pressure sensitive adhesive member, and the display module are configured to enter and exit from the housing in the first direction;
   a first rotation member in the housing and extending in the second direction, wherein the window member and the first pressure sensitive adhesive member are rollable or slidable on the first rotation member; and
   a second rotation member spaced apart from the first rotation member in the housing and extending in the second direction, wherein the display module is rollable or slidable on the second rotation member.

2. The rollable display device of claim 1, wherein, in an unrolled state, a length of the window member extending in the first direction is greater than a length of the display module extending in the first direction,
   wherein the first rotation member is located under the first pressure sensitive adhesive member, and the second rotation member is located under the second module surface of the display module.

3. The rollable display device of claim 2, wherein the first rotation member is farther away from the groove in the first direction than the second rotation member is from the groove.

4. The rollable display device of claim 1, wherein, in an unrolled state, a length of the window member extending in the first direction is equal to a length of the display module extending in the first direction,
wherein the first rotation member is located on the first window surface of the window member, and the second rotation member is located under the second module surface of the display module.

5. The rollable display device of claim 4, wherein a distance of the first rotation member from the groove in the first direction is equal to a distance of the second rotation member from the groove in the first direction.

6. The rollable display device of claim 1, wherein the first pressure sensitive adhesive member includes an acrylic-based adhesive material.

7. The rollable display device of claim 1, wherein the display module comprises:
a display panel to display an image;
a driving substrate electrically connected to the display panel and extending in the second direction; and
a connection substrate connecting the display panel and the driving substrate,
wherein the driving substrate is arranged in the second rotation member, and the display panel is rollable on the second rotation member.

8. The rollable display device of claim 1, further comprising:
a handle extending in the second direction and coupled to the display module,
wherein the display module comprises:
a display panel to display an image;
a driving substrate electrically connected to the display panel and extending in the second direction; and
a connection substrate connecting the display panel and the driving substrate,
wherein the driving substrate is arranged in the handle, and the display panel is slidable on the second rotation member.

9. The rollable display device of claim 1, further comprising a cleaning rotation member in the housing and located under the first pressure sensitive adhesive member to remove a foreign material attached to the first pressure sensitive adhesive member when the first pressure sensitive adhesive member and the display module are detached from each other.

10. The rollable display device of claim 1, further comprising:
a protective member under the display module and comprising a first protective surface facing the second module surface, and a second protective surface opposite to the first protective surface, wherein the first protective surface is between the second module surface and the second protective surface;
a second pressure sensitive adhesive member which is fixed on the first protective surface and which is detachable from and attachable to the second module surface; and
a third rotation member spaced apart from the first and second rotation members in the housing, wherein the protective member and the second pressure sensitive adhesive member are rollable or slidable on the third rotation member.

11. The rollable display device of claim 10, wherein the protective member comprises a plurality of supporting blocks extending in the second direction and arranged in the first direction, and
wherein adjacent ones of the supporting blocks are connected to each other by a hinge.

12. The rollable display device of claim 10, wherein, in an unrolled state, a length of the window member extending in the first direction is greater than a length of the display module extending in the first direction, and, in the unrolled state, the length of the display module extending in the first direction is greater than a length of the protective member extending in the first direction,
wherein the first rotation member is located under the first pressure sensitive adhesive member, the second rotation member is located under the second module surface of the display module, and the third rotation member is located under the second protective surface of the protective member,
wherein the first rotation member is farther away from the groove in the first direction than the second rotation member is from the groove, and the second rotation member is farther away from the groove in the first direction than the third rotation member is from the groove.

13. The rollable display device of claim 10, wherein, in an unrolled state, a length of the window member extending in the first direction is less than a length of the display module extending in the first direction, and, in the unrolled state, a length of the protective member extending in the first direction is less than or equal to the length of the display module extending in the first direction,
wherein the first rotation member is located on the window member, the second rotation member is located on the first module surface or under the second module surface of the display module, and the third rotation member is located under the second protective surface of the protective member,
wherein the first rotation member is closer to the groove in the first direction than the second rotation member, and
wherein the second rotation member is farther away from the groove in the first direction than the third rotation member, or a distance of the second rotation member from the groove in the first direction is equal to a distance of the third rotation member from the groove in the first direction.

14. The rollable display device of claim 10, wherein each of the first, second, and third rotation members has a cylindrical shape,
wherein a radius of the first rotation member, a radius of the second rotation member, and a radius of the third rotation member are equal to each other, and
wherein the window member is rolled on the first rotation member, the display module is rolled on the second rotation member, and the protective member is rolled on the third rotation member.

15. The rollable display device of claim 10, wherein each of the first, second, and third rotation members has a cylindrical shape,
wherein a radius of the first rotation member and a radius of the third rotation member are greater than a radius of the second rotation member, wherein the window member is slidable by the first rotation member, the display module is rollable on the second rotation member, and the protective member is slidable by the third rotation member.

16. A rollable display device comprising:
a display module to provide an image;
a window member on the display module to protect the display module;
a first pressure sensitive adhesive member located between the display module and the window member;
a housing having a groove through which the display module, the window member, and the first pressure sensitive adhesive member are configured to enter and exit from the housing in parallel to a first direction;
a first rotation member on which the window member and the first pressure sensitive adhesive member are rollable or slidable; and
a second rotation member which is spaced apart from the first rotation member and on which the display module is rollable or slidable,
wherein a top surface of the display module is detachable from a bottom surface of the first pressure sensitive adhesive member such that the display module is spaced apart from the window member, when the display module, the window member, and the first pressure sensitive adhesive member enter the housing, and
wherein the top surface of the display module is attachable to the bottom surface of the first pressure sensitive adhesive member such that the display module is integrated with the window member, when the display module, the window member, and the first pressure sensitive adhesive member exit from the housing.

17. The rollable display device of claim 16, further comprising:
a protective member under the display module to protect the display module;
a second pressure sensitive adhesive member between the protective member and the display module; and
a third rotation member which is spaced apart from the first and second rotation members in the housing and which is configured to roll or slide the protective member and the second pressure sensitive adhesive member,
wherein a bottom surface of the display module is detachable from a top surface of the second pressure sensitive adhesive member such that the display module is spaced apart from the protective member, when the display module, the window member, the first pressure sensitive adhesive member, the protective member, and the second pressure sensitive adhesive member enter the housing, and
wherein the bottom surface of the display module is attachable to the top surface of the second pressure sensitive adhesive member such that the display module is integrated with the protective member, when the display module, the window member, the first pressure sensitive adhesive member, the protective member, and the second pressure sensitive adhesive member exit from the housing.

18. The rollable display device of claim 17, further comprising:
a first pressing rotation member comprising: a first roller on the window member in the housing; and a second roller under the display module in the housing; and
a second pressing rotation member adjacent to the groove in the housing and comprising: a third roller on the window member; and a fourth roller under the protective member,
wherein when the window member, the first pressure sensitive adhesive member, the display module, the second pressure sensitive adhesive member, and the protective member exit from the housing, the first roller and the second roller are configured to respectively press the window member and the display module to attach the top surface of the display module to the bottom surface of the first pressure sensitive adhesive member such that the display module is integrated with the window member, and the third roller and the fourth roller are configured to respectively press the window member and the display module integrated with each other and the protective member to attach the bottom surface of the display module to the top surface of the second pressure sensitive adhesive member such that the display module is integrated with the protective member.

19. The rollable display device of claim 17, wherein, in an unrolled state, a length of the protective member extending in the first direction is less than a length of the display module extending in the first direction, and, in the unrolled state, a length of the window member extending in the first direction is greater than the length of the display module extending in the first direction,
wherein the first rotation member is located under the first pressure sensitive adhesive member, the second rotation member is located under the display module, and the third rotation member is located under the protective member,
wherein the first rotation member, the second rotation member, and the third rotation member are rotatable in a counterclockwise direction when the display module, the window member, the first pressure sensitive adhesive member, the protective member, and the second pressure sensitive adhesive member enter the housing.

20. The rollable display device of claim 16, wherein the housing is installed in a vehicle such that the display module provides the image to a driver.

* * * * *